(12) United States Patent
Yoshikawa et al.

(10) Patent No.: US 10,652,997 B2
(45) Date of Patent: May 12, 2020

(54) SWITCHING POWER SUPPLY DEVICE

(71) Applicant: Panasonic Intellectual Property Management Co., Ltd., Osaka (JP)

(72) Inventors: Akitaka Yoshikawa, Osaka (JP); Tatehiko Inoue, Osaka (JP); Hisazumi Watanabe, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/270,517

(22) Filed: Feb. 7, 2019

(65) Prior Publication Data

US 2019/0269006 A1 Aug. 29, 2019

(30) Foreign Application Priority Data

Feb. 23, 2018 (JP) .................................. 2018-030823
Jul. 9, 2018 (JP) .................................. 2018-130049

(51) Int. Cl.
*H05K 1/02* (2006.01)
*H02M 7/00* (2006.01)
(Continued)

(52) U.S. Cl.
CPC .......... *H05K 1/0216* (2013.01); *H01L 25/00* (2013.01); *H02M 7/003* (2013.01);
(Continued)

(58) Field of Classification Search
None
See application file for complete search history.

(56) References Cited

U.S. PATENT DOCUMENTS 8,680,830 B2 * 3/2014 Kudo .................. H02M 3/1584
323/283
RE45,819 E * 12/2015 Kajigaya ............. G11C 11/4091
(Continued)

FOREIGN PATENT DOCUMENTS

| EP | 0828341 B1 | 12/2003 |
| JP | 2001-286156 | 10/2001 |
| JP | 2004-229393 | 8/2004 |

OTHER PUBLICATIONS

German Office Action from the German Patent and Trademark Office dated Nov. 11, 2019 for the related German Patent Application No. 102019103032.3, together with an English language translation.

*Primary Examiner* — Courtney L Smith
(74) *Attorney, Agent, or Firm* — Greenblum & Bernstein, P.L.C.

(57) ABSTRACT

The present disclosure reduces parasitic inductances of current paths between components. First conductor path is provided on a surface of insulating layer. One of a power supply voltage and a ground voltage is applied to first conductor path. Second conductor path is provided on the surface of insulating layer. The other of the power supply voltage and the ground voltage is applied to second conductor path. First switching element is connected to output pattern and to first conductor path. Second switching element is connected to output pattern and to second conductor path. At least one of first conductor path and second conductor path has a continuous annular path.

16 Claims, 15 Drawing Sheets

(51) Int. Cl.
*H02M 7/5387* (2007.01)
*H05K 1/18* (2006.01)
*H01L 25/00* (2006.01)
*H02P 27/06* (2006.01)

(52) U.S. Cl.
CPC ........ *H02M 7/5387* (2013.01); *H05K 1/0203* (2013.01); *H05K 1/181* (2013.01); *H02P 27/06* (2013.01); *H05K 2201/10053* (2013.01); *H05K 2201/10409* (2013.01)

(56) References Cited

U.S. PATENT DOCUMENTS

| | | | | |
|---|---|---|---|---|
| 9,246,449 | B2* | 1/2016 | Williams | H01L 27/092 |
| 9,621,094 | B2* | 4/2017 | Vrankovic | H02P 27/06 |
| 9,735,127 | B2* | 8/2017 | Danno | H01L 23/047 |
| 10,279,760 | B2* | 5/2019 | Froeschl | B60R 16/03 |
| 10,454,254 | B2* | 10/2019 | Kin | H05K 7/20572 |
| 2015/0145463 | A1* | 5/2015 | Vrankovic | H02P 27/06 318/503 |

* cited by examiner

SWITCHING POWER SUPPLY DEVICE

TECHNICAL FIELD

The present disclosure relates to switching power supply devices.

BACKGROUND ART

Heretofore, switching power supply devices are known. For example, PTL 1 discloses a semiconductor device that includes: a metal substrate; an insulator formed so as to cover one surface of the metal substrate; a positive conductor formed on the insulator; a negative conductor formed on the insulator; a group of switching elements that is formed on the insulator and that is connected to the positive conductor and to the negative conductor; and a loop conductor that is electrically insulated, by the insulator, from the positive conductor and the negative conductor. Further, the loop conductor is disposed in substantially parallel to the positive conductor and to the negative conductor. In this semiconductor device, when a direct electric current flows through the positive conductor and the negative conductor, an induced electric current is induced in the loop conductor. Then, the induced electric current induced in the loop conductor generates a magnetic field, which weakens a magnetic field generated by the direct electric current flowing through the positive conductor and the negative conductor. In this way, an inductance (total inductance) of the positive and negative conductors is reduced.

CITATION LIST

Patent Literature

PTL 1: Unexamined Japanese Patent Publication No. 2004-229393

SUMMARY OF THE INVENTION

Technical Problem

In PTL 1, however, it may be difficult to shorten current paths between components (for example, transistors and capacitors) constituting a switching power supply device. Therefore, parasitic inductances of the current paths between the components constituting the switching power supply device may be difficult to reduce.

Solution to Problem

A switching power supply device of the present disclosure includes: a substrate having an insulating layer and a conductive layer, the conductive layer being formed on one surface of the insulating layer and provided with an output pattern; a first conductor path provided on the one surface of the insulating layer, the first conductor path being applied with one of a power supply voltage and a ground voltage; a second conductor path provided on the one surface of the insulating layer, the second conductor path being applied with another of the power supply voltage and the ground voltage; a first switching element connected to the output pattern and to the first conductor path; and a second switching element connected to the output pattern and to the second conductor path. At least one of the first conductor path and the second conductor path has a continuous annular path.

Advantageous Effect of Invention

According to the present disclosure, it is possible to shorten current paths between components constituting a switching power supply device, thereby successfully reducing parasitic inductances of these current paths.

DESCRIPTION OF EMBODIMENTS

Exemplary embodiments will be described below in detail with reference to the accompanying drawings. It should be noted that identical or equivalent parts are given identical reference signs, and the description of such parts will not be repeated.

First Exemplary Embodiment

Figure 1:
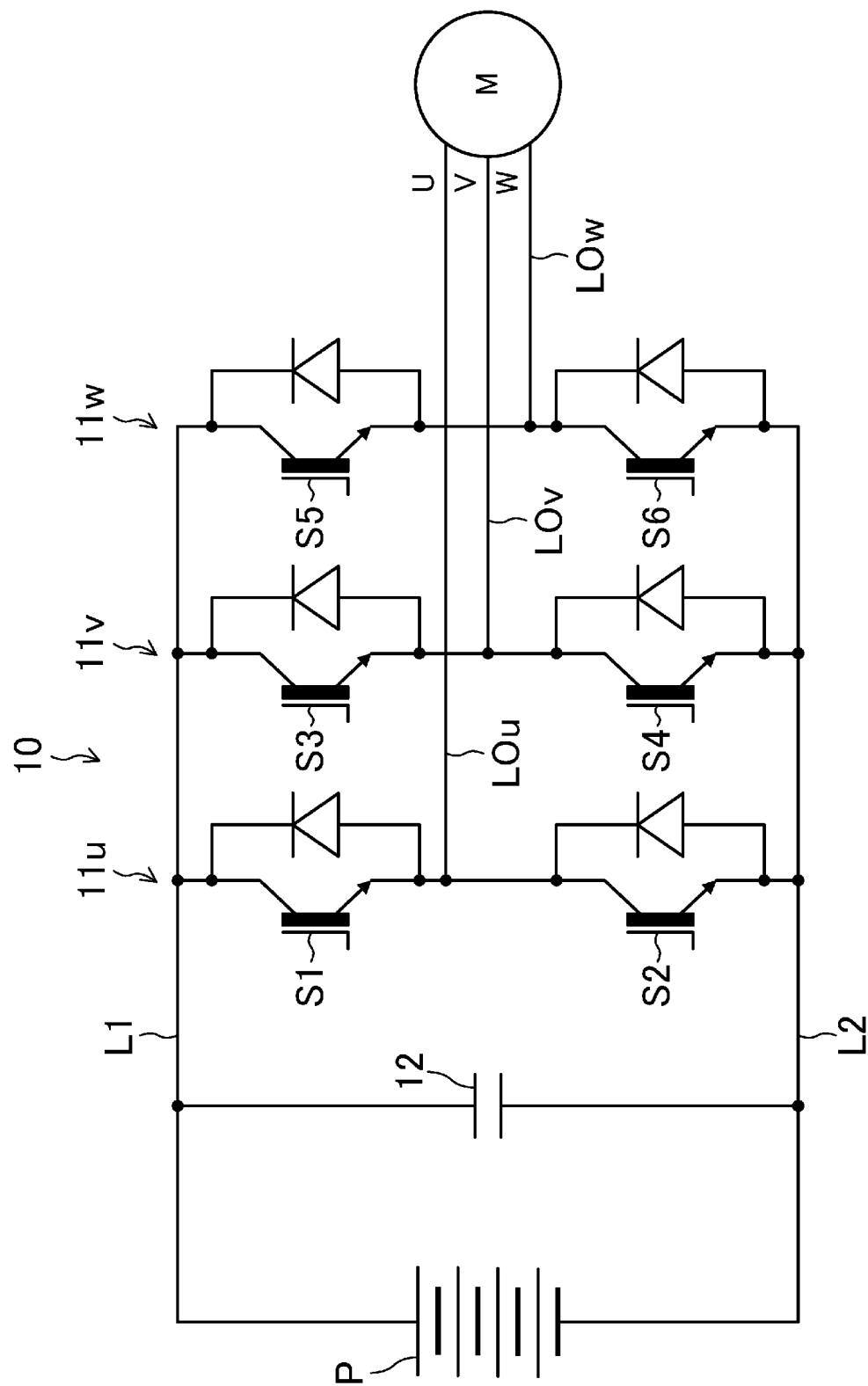
FIG. 1 is a circuit diagram illustrating a configuration of a switching power supply device according to a first exemplary embodiment.

FIG. 1 illustrates a configuration of switching power supply device 10 according to a first exemplary embodiment. Switching power supply device 10 performs a switching operation to convert electric power supplied from a power source (direct current (DC) power supply P in this example) into output electric power and then supplies this output electric power to a load (motor M in this example). In this example, motor M may be a three-phase alternating current (AC) motor, and switching power supply device 10 may serve as an inverter that converts DC power into three-phase AC power.

Specifically, switching power supply device 10 includes: first connection line L1; second connection line L2; three output lines (first output line LOu, second output line LOv, third output line LOw); three switching sections (first switching section 11u, second switching section 11v, third switching section 11w); and smoothing capacitor section 12.

[Connection Lines]

One of a power supply voltage and a ground voltage is applied to first connection line L1. The other of the power supply voltage and the ground voltage is applied to second connection line L2. In this example, the power supply voltage is applied to first connection line L1, which is connected to an end (positive electrode) of DC power supply P, and the ground voltage is applied to second connection line L2, which is connected to the other end (negative electrode) of DC power supply P.

[Switching Sections]

First switching section 11u includes first switching element S1 and second switching element S2. A node between first switching element S1 and second switching element S2 is connected to a U-phase coil (not illustrated) of motor M via first output line LOu.

Second switching section 11v includes third switching element S3 and fourth switching element S4. A node between third switching element S3 and fourth switching element S4 is connected to a V-phase coil (not illustrated) of motor M via second output line LOv.

Third switching section 11w includes fifth switching element S5 and sixth switching element S6. A node between fifth switching element S5 and sixth switching element S6 is connected to a W-phase coil (not illustrated) of motor M via third output line LOw.

In the figure, six circulating diodes are connected in parallel to respective six switching elements S1 to S6. These circulating diodes correspond to parasitic diodes of switching elements S1 to S6.

[Smoothing Capacitor Section]

Smoothing capacitor section 12 is connected between first connection line L1 and second connection line L2.

[Structure of Switching Power Supply Device]

Figure 2:
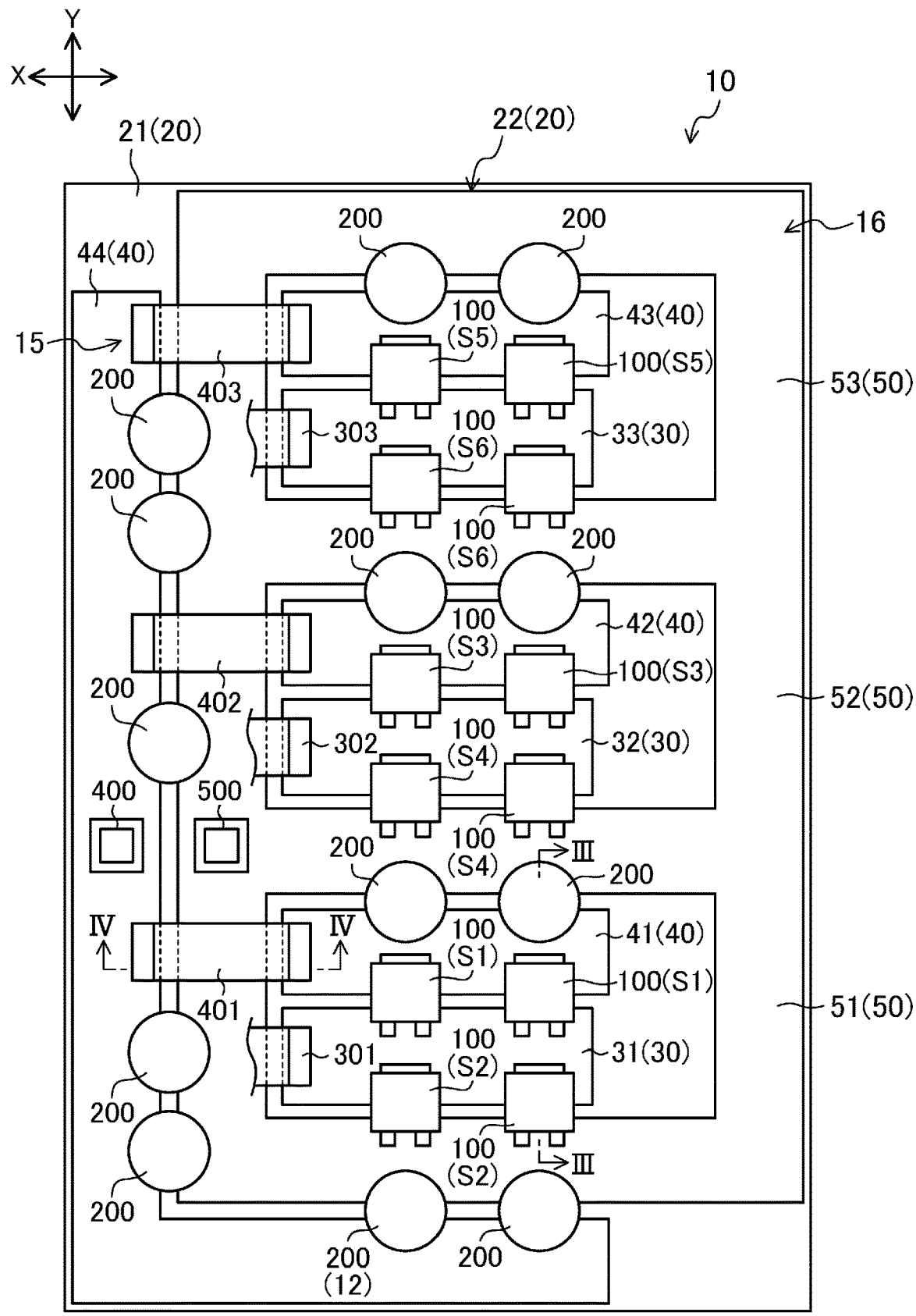
FIG. 2 is a plan view illustrating a structure of the switching power supply device according to the first exemplary embodiment.
Figure 3:
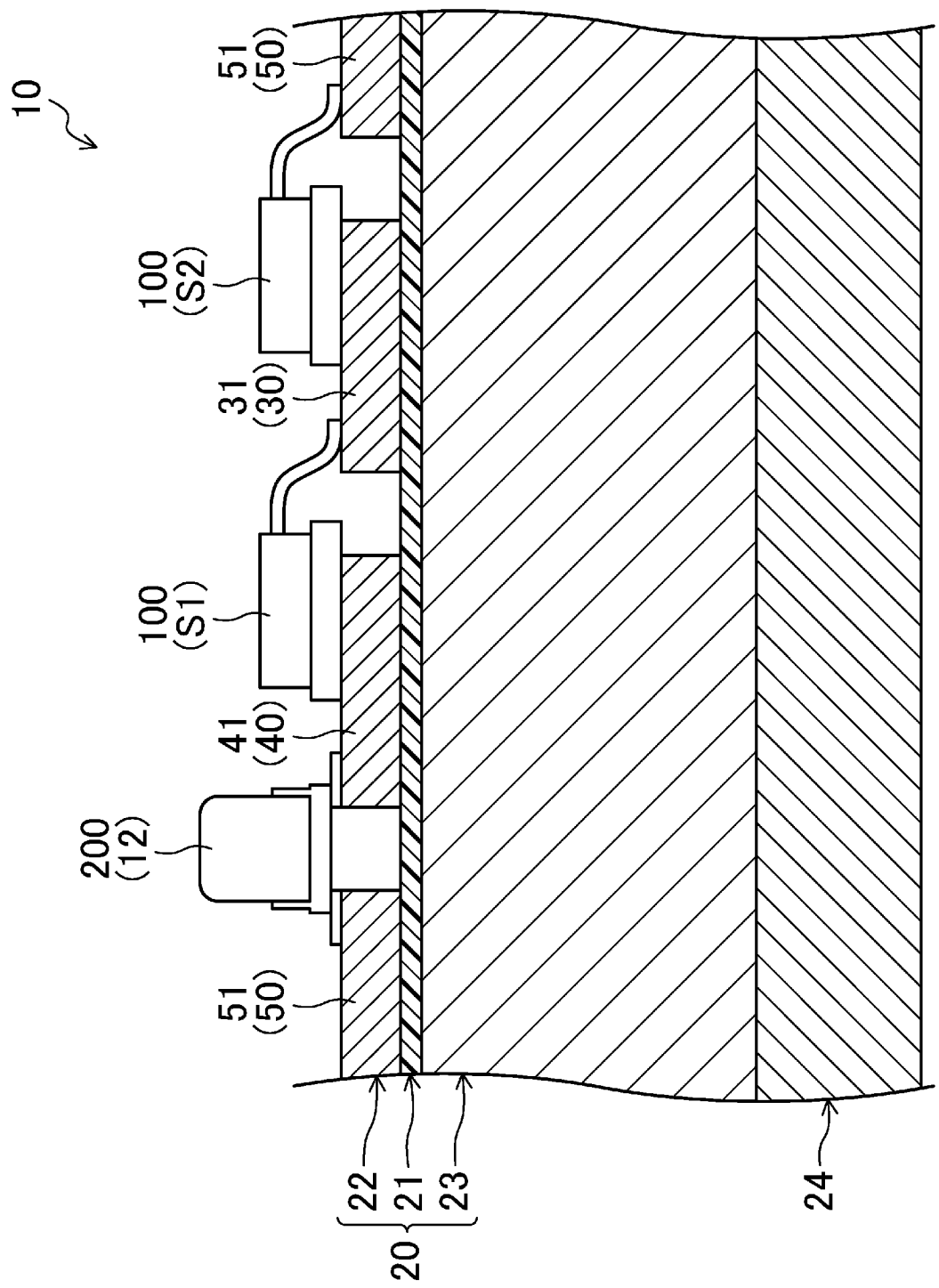
FIG. 3 is a cross-sectional view illustrating the structure of the switching power supply device according to the first exemplary embodiment.
Figure 4:
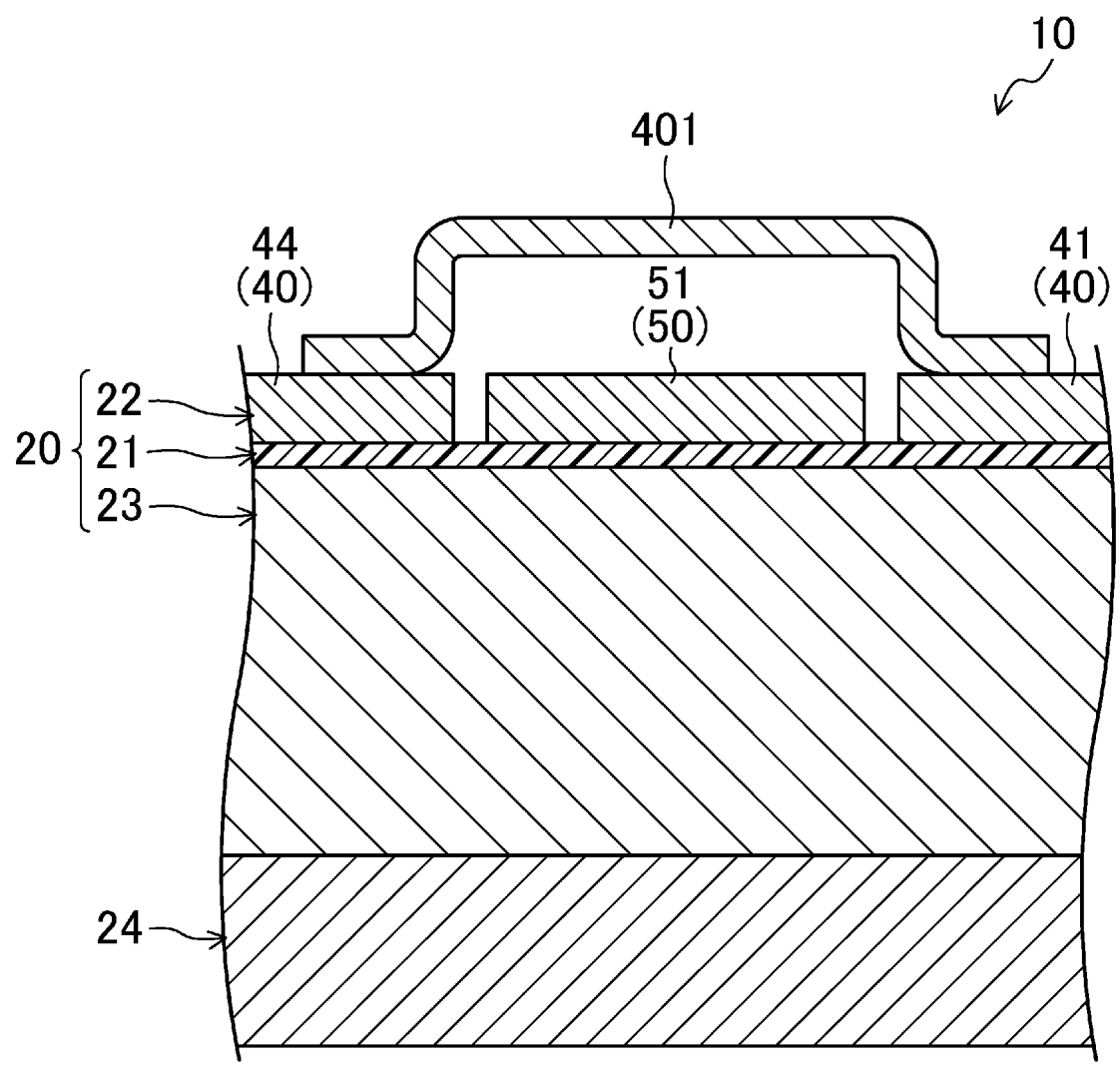
FIG. 4 is a cross-sectional view illustrating the structure of the switching power supply device according to the first exemplary embodiment.

Next, a description will be given of a structure of switching power supply device 10 according to the first exemplary embodiment, with reference to FIGS. 2 to 4. FIG. 2 is a schematic plan view illustrating a planar structure of switching power supply device 10. FIGS. 3 and 4 are each a schematic cross-sectional view illustrating a part of a cross-sectional structure of switching power supply device 10. FIG. 3 corresponds to a cross-sectional view taken along line III-III in FIG. 2; FIG. 4 corresponds to a cross-sectional view taken along line IV-IV in FIG. 2. Switching power supply device 10 is provided with substrate 20.

[Substrate]

Substrate 20 includes insulating layer 21, conductive layer 22, and heat dissipation layer 23. In this example, substrate 20 is formed in a rectangular shape.

Insulating layer 21, made of an insulating material (for example, epoxy resin sheet), is formed in a planar shape. Conductive layer 22, made of a conductive material (for example, copper), is provided on one surface of insulating layer 21 and formed into a thin foil. Heat dissipation layer 23, made of a material that conducts heat (for example, aluminum), is provided on the other surface of insulating layer 21.

In this example, insulating layer 21 is smaller in thickness than any of conductive layer 22 and heat dissipation layer 23. Heat dissipation layer 23 is greater in thickness than conductive layer 22. For example, the thickness of insulating layer 21 may be set to about 100 μm, the thickness of conductive layer 22 may be set to about 200 μm, and the thickness of heat dissipation layer 23 may be set in a range from about 1 mm to about 3 mm. A thermal conductivity of insulating layer 21 is lower than a thermal conductivity of any of conductive layer 22 and heat dissipation layer 23. The thermal conductivity of conductive layer 22 is higher than the thermal conductivity of heat dissipation layer 23.

<Heat Dissipation Member>

In this example, heat dissipation layer 23 is bonded and fixed to heat dissipation member 24. For example, heat dissipation member 24 corresponds to a portion of a housing (not illustrated) that contains substrate 20. Heat dissipation member 24 is cooled by means of air cooling (cooled by air) or liquid cooling (cooled by a liquid such as cooling water or cooling oil).

[Structure of Conductive Layer]

Conductive layer 22 has wiring patterns formed therein. More specifically, output patterns 30, first conductor patterns 40, and second conductor pattern 50 are formed in conductive layer 22.

[Output Patterns]

Output patterns 30 are wiring patterns that form midway portions (nodes between two switching elements interconnected in series) of switching sections 11u to 11w illustrated in FIG. 1. Output patterns 30 include first output region 31, second output region 32, and third output region 33.

In this example, each of first output region 31, second output region 32, and third output region 33 is formed so as to extend in first direction X. In addition, first output region 31, second output region 32, and third output region 33 are arranged in order at predetermined intervals in second direction Y, second direction Y being orthogonal to first direction X. In this example, first direction X is a direction along a shorter side of substrate 20, whereas second direction Y is a direction along a longer side of substrate 20.

In this example, each of first output region 31, second output region 32, and third output region 33 is formed in a rectangular shape.

[Conductor Patterns]

First conductor patterns 40 are wiring patterns that form portions of first connection line L1 illustrated in FIG. 1, whereas second conductor pattern 50 is a wiring pattern that forms a portion of second connection line L2 illustrated in FIG. 1. One of the power supply voltage and the ground voltage (power supply voltage in this example) is applied to first conductor pattern 40, whereas the other of the power supply voltage and the ground voltage (ground voltage in this example) is applied to second conductor pattern 50.

First conductor patterns 40 include first counter region 41, second counter region 42, third counter region 43, and interconnection region 44. Second conductor pattern 50 includes first annular region 51, second annular region 52, and third annular region 53.

<Counter Regions>

First counter region 41, second counter region 42, and third counter region 43 face first output region 31, second output region 32, and third output region 33, respectively, with a predetermined spacing therebetween.

In this example, first counter region 41, second counter region 42, and third counter region 43 have portions extending in first direction X so as to be along first output region 31, second output region 32, and third output region 33, respectively. More specifically, first counter region 41 is formed in a rectangular shape, an entire area of which extends in first direction X. A configuration (shape) of second counter region 42 and third counter region 43 is similar to the configuration (shape) of first counter region 41.

In this example, from one side to the other in second direction Y (from the lower side to the upper side in FIG. 2), first output region 31, first counter region 41, second output region 32, second counter region 42, third output region 33, and third counter region 43 are arranged in this order. In other words, the output regions and counter regions are arranged alternately from one side to the other in first direction X.

<Annular Region>

First annular region 51 is formed so as to continuously surround both first output region 31 and first counter region 41. Second annular region 52 is formed so as to continuously surround both second output region 32 and second counter region 42. Third annular region 53 is formed so as to continuously surround both third output region 33 and third counter region 43.

In this example, first annular region 51 and second annular region 52 are formed such that their portions (more specifically, the portions located between first output region 31 and second output region 32) become continuous. Likewise, second annular region 52 and third annular region 53 are formed such that their portions (more specifically, the portions located between second output region 32 and third output region 33) become continuous. This configuration causes first annular region 51, second annular region 52, and third annular region 53 to constitute a continuous annular region (region having a shape of interconnected rings, namely, the shape of three rectangles interconnected in series).

In this example, first annular region 51, second annular region 52, and third annular region 53 are formed such that their inner and outer edges each have a rectangular shape. In short, each of first annular region 51, second annular region 52, and third annular region 53 is formed in a shape of a rectangular frame.

<Interconnection Region>

Interconnection region 44 is formed so as to be along first annular region 51, second annular region 52, and third annular region 53. In this example, interconnection region 44 is formed in an L shape and has a first extending part and a second extending part. The first extending part extends in second direction Y so as to be along one edge (left edge in FIG. 2), in first direction X, of the continuous annular region, which is constituted of first annular region 51, second annular region 52, and third annular region 53. The second extending part extends in first direction X so as to be along one edge (lower edge in FIG. 2), in second direction Y, of the continuous annular region.

[Terminals]

Switching power supply device 10 includes first terminal 400 and second terminal 500. First terminal 400, to which one of the power supply voltage and the ground voltage is applied, is connected to first conductor pattern 40. Second terminal 500, to which the other of the power supply voltage and the ground voltage is applied, is connected to second conductor pattern 50. In this example, the power supply voltage is applied to first terminal 400, which is connected to one end (positive electrode) of DC power supply P via a power line (not illustrated), for example, whereas the ground voltage is applied to second terminal 500, which is connected to the other end (negative electrode) of DC power supply P via another power line (not illustrated), for example.

First terminal 400 is disposed within interconnection region 44. Second terminal 500 is disposed within the continuous annular region, which is constituted of first annular region 51, second annular region 52, and third annular region 53. First terminal 400 and second terminal 500 are disposed adjacent to each other. More specifically, in this example, second terminal 500 is disposed in a middle, in second direction Y, of one edge part (left edge part in FIG. 2), in first direction X, of the continuous annular region (specifically, the middle corresponds to a portion located between first counter region 41 and second output region 32 in second direction Y). First terminal 400 is disposed within the first extending part of interconnection region 44 (portion extending in second direction Y) so as to face (be adjacent to) second terminal 500 in first direction X.

[Conductive Paths]

Switching power supply device 10 includes first conductive path 401, second conductive path 402, and third conductive path 403, which correspond to, respectively, first counter region 41, second counter region 42, and third counter region 43.

First conductive path 401 extends between interconnection region 44 and first counter region 41 over a portion of first annular region 51, thereby connecting interconnection region 44 to first counter region 41. Second conductive path 402 extends between interconnection region 44 and second counter region 42 over a portion of second annular region 52, thereby connecting interconnection region 44 to second counter region 42. Third conductive path 403 extends between interconnection region 44 and first counter region 41 over a portion of third annular region 53, thereby connecting interconnection region 44 to first counter region 41. In this example, each of first conductive path 401, second conductive path 402, and third conductive path 403 extends in first direction X.

Each of first conductive path 401, second conductive path 402, and third conductive path 403 is formed of a conductive member (bus bar) having a planar shape. As illustrated in FIG. 4, the conductive member of first conductive path 401 is bonded at one end to first counter region 41 with soldering and at the other end to the first extending part (portion extending in second direction Y) of interconnection region 44 with soldering. Likewise, the conductive member of second conductive path 402 (or third conductive path 403) is bonded at one end to second counter region 42 (or third counter region 43) with soldering and at the other end to the first extending part (portion extending in second direction Y) of interconnection region 44 with soldering.

The configuration in which first conductive path 401 connects interconnection region 44 to first counter region 41 can supply the voltage (power supply voltage in this example) applied to first terminal 400 provided within interconnection region 44 to first counter region 41 via first conductive path 401. Likewise, the configuration in which second conductive path 402 connects interconnection region 44 to second counter region 42 can supply the voltage applied to first terminal 400 to second counter region 42 via second conductive path 402. The configuration in which third conductive path 403 connects interconnection region 44 to third counter region 43 can supply the voltage applied to first terminal 400 to third counter region 43 via third conductive path 403.

[Conductor Paths]

Switching power supply device 10 configured as above includes first conductor path 15 and second conductor path 16. First conductor path 15 is provided on one surface of insulating layer 21. One of the power supply voltage and the ground voltage (power supply voltage in this example) is applied to first conductor path 15. Second conductor path 16 is provided on the one surface of insulating layer 21. The other of the power supply voltage and the ground voltage (ground voltage in this example) is applied to second conductor path 16. At least one of first conductor path 15 and second conductor path 16 (second conductor path 16 in this example) has a continuous annular path. More specifically, in this example, first conductor path 15 includes first conductor patterns 40 (first counter region 41, second counter region 42, third counter region 43, and interconnection region 44), first conductive path 401, second conductive path 402, and third conductive path 403. Second conductor path 16 includes second conductor pattern 50 (first annular region 51, second annular region 52, and third annular region 53).

[Output Connection Member]

Switching power supply device 10 includes first output connection member 301, second output connection member 302, and third output connection member 303 that are related to, respectively, first output region 31, second output region 32, and third output region 33.

First output connection member 301 is connected to first output region 31. Second output connection member 302 is connected to second output region 32. Third output connection member 303 is connected to third output region 33. Each of first output connection member 301, second output connection member 302, and third output connection member 303 is made of a conductive material (for example, aluminum or copper). In this example, all of first output connection member 301, second output connection member 302, and third output connection member 303 extend in first direction X.

Each of first output connection member 301, second output connection member 302, and third output connection member 303 is formed in a planar shape. More specifically, each of first output connection member 301, second output connection member 302, and third output connection member 303 is formed of a bus bar (conductive member formed in a planar shape). First output connection member 301 is bonded at one end to first output region 31 with soldering and at the other end to a load (motor M in this example) via a power line (not illustrated), for example. Likewise, second output connection member 302 is bonded at one end to second output region 32 with soldering and at the other end to the load (motor M in this example) via another power line (not illustrated), for example. Third output connection member 303 is bonded at one end to third output region 33 with soldering and at the other end to the load (motor M in this example) via another power line (not illustrated), for example.

(Switching Elements)

As described above, switching power supply device 10 include first switching element S1, second switching element S2, third switching element S3, fourth switching element S4, fifth switching element S5, and sixth switching element S6. First switching element S1 is connected to first output region 31 and to first counter region 41. Second switching element S2 is connected to first output region 31 and to first annular region 51. Third switching element S3 is connected to second output region 32 and to second counter region 42. Fourth switching element S4 is connected to second output region 32 and to second annular region 52. Fifth switching element S5 is connected to third output region 33 and to third counter region 43. Sixth switching element S6 is connected to third output region 33 and to third annular region 53. In short, first switching element S1, third switching element S3, and fifth switching element S5 are connected to output patterns 30 and to first conductor path 15, whereas second switching element S2, fourth switching element S4, and sixth switching element S6 are connected to output patterns 30 and to second conductor path 16.

In this example, each of first switching element S1, second switching element S2, third switching element S3, fourth switching element S4, fifth switching element S5, and sixth switching element S6 includes a plurality of (more specifically, two) transistors 100 interconnected in series. Since each of first switching element S1, second switching element S2, third switching element S3, fourth switching element S4, fifth switching element S5, and sixth switching element S6 is constituted of the plurality of transistors 100 interconnected in series, switching power supply device 10 is configured to be able to support large electric current.

Two transistors 100 constituting first switching element S1 are arrayed in first direction X while mounted on a surface of first counter region 41, and are connected to first output region 31. More specifically, transistors 100 are placed within first counter region 41. One end (drain) of each of transistors 100, which is formed in a planar shape, is disposed on a bottom of a main body of each of transistors 100 and bonded to the surface of first counter region 41 with soldering. Another end (source) of each of transistors 100 extends from a side of the main body to first output region 31 and is bonded to a surface of first output region 31 with soldering. A gate of each of transistors 100 is electrically connected to a gate wire (not illustrated). For example, each of transistors 100 may be a surface-mounted type of field effect transistor (FET).

Two transistors 100 constituting second switching element S2 are arrayed in first direction X so as to face (be adjacent to), in second direction Y, two corresponding transistors 100 constituting first switching element S1. Two transistors 100 in second switching element S2 are mounted on the surface of first output region 31 and connected to first annular region 51.

Two transistors 100 constituting third switching element S3 are arrayed in first direction X while mounted on a surface of second counter region 42, and connected to second output region 32. Two transistors 100 constituting fourth switching element S4 are arrayed in first direction X so as to face (be adjacent to), in second direction Y, two corresponding transistors 100 constituting third switching element S3. Two transistors 100 in fourth switching element S4 are mounted on a surface of second output region 32 and connected to second annular region 52. In this example, two transistors 100 constituting fourth switching element S4 face, in second direction Y, two corresponding transistors 100 constituting first switching element S1.

Two transistors 100 constituting fifth switching element S5 are arrayed in first direction X while mounted on a surface of third counter region 43, and connected to third output region 33. Two transistors 100 constituting sixth switching element S6 are arrayed in first direction X so as to face (be adjacent to), in second direction Y, two corresponding transistors 100 constituting fifth switching element S5 while mounted on a surface of third output region 33, and connected to third annular region 53. In this example, two transistors 100 constituting sixth switching element S6 face, in second direction Y, two corresponding transistors 100 constituting third switching element S3.

[Smoothing Capacitor Section]

As described above, switching power supply device 10 is provided with smoothing capacitor section 12. Smoothing capacitor section 12 is provided in conductive layer 22. In this example, smoothing capacitor section 12 includes a plurality of capacitors 200.

Each of the plurality of capacitors 200 is connected to first conductor pattern 40 (first conductor path 15) and to second conductor pattern 50 (second conductor path 16). In this example, capacitors 200 are mounted on surfaces of first conductor pattern 40 and second conductor pattern 50. More specifically, capacitors 200 are placed so as to extend from first conductor pattern 40 to second conductor pattern 50. One end (positive electrode in this example) of each of capacitors 200 is bonded to a surface of first conductor pattern 40 with soldering, whereas the other end (negative electrode in this example) of each of capacitors 200 is bonded to a surface of second conductor pattern 50 with soldering. For example, each of capacitors 200 may be an electrolytic capacitor, a film capacitor, or a ceramic capacitor.

In this example, smoothing capacitor section 12 has thirteen capacitors 200, which includes two capacitors 200 related to first switching element S1, two capacitors 200 related to second switching element S2, two capacitors 200 related to third switching element S3, and two capacitors 200 related to fifth switching element S5.

Two capacitors 200 related to first switching element S1 are arrayed in first direction X so as to face (be adjacent to), in second direction Y, two corresponding transistors 100 constituting first switching element S1 while mounted on the surface of first counter region 41 and a surface of first annular region 51. In this example, those two capacitors 200 are also related to fourth switching element S4 and face (be adjacent to), in second direction Y, two corresponding transistors 100 constituting fourth switching element S4. In other words, two transistors 100 constituting first switching element S1 face, in second direction Y, two transistors 100 constituting fourth switching element S4 with two capacitors 200 disposed therebetween.

Two capacitors 200 related to second switching element S2 are arrayed in first direction X so as to face (be adjacent to), in second direction Y, two corresponding transistors 100 constituting second switching element S2 while mounted on the surface of first annular region 51 and a surface of the second extending part (portion extending in first direction X) of interconnection region 44.

Two capacitors 200 related to third switching element S3 are arrayed in first direction X so as to face (be adjacent to), in second direction Y, two corresponding transistors 100 constituting third switching element S3 while mounted on the surface of second counter region 42 and a surface of second annular region 52. In this example, those two capacitors 200 are also related to sixth switching element S6 and face (be adjacent to), in second direction Y, two corresponding transistors 100 constituting sixth switching element S6. In other words, two transistors 100 constituting third switching element S3 face, in second direction Y, two transistors 100 constituting sixth switching element S6 with two capacitors 200 disposed therebetween.

Two capacitors 200 related to fifth switching element S5 are arrayed in first direction X so as to face (be adjacent to), in second direction Y, two corresponding transistors 100 constituting fifth switching element S5 while mounted on the surface of third counter region 43 and a surface of third annular region 53.

In this example, of thirteen capacitors 200, five remaining capacitors 200 include: two capacitors 200 mounted on the surface of first annular region 51 and a surface of the first extending part (portion extending in second direction Y) of interconnection region 44; and one capacitor 200 mounted on the surfaces of second annular region 52 and the first extending part of interconnection region 44; and two capacitors 200 mounted on the surfaces of third annular region 53 and the first extending part of interconnection region 44.

[Comparison Between Exemplary Embodiment and Comparative Example]

Next, switching power supply device 10 according to the first exemplary embodiment will be compared to a comparative example of the switching power supply device (hereinafter referred to as "switching power supply device 80"), with reference to FIGS. 5 and 6. Hereinafter, a description will be given by exemplifying a current path that extends from transistors 100 constituting second switching element S2 to second terminal 500.

Figure 5:
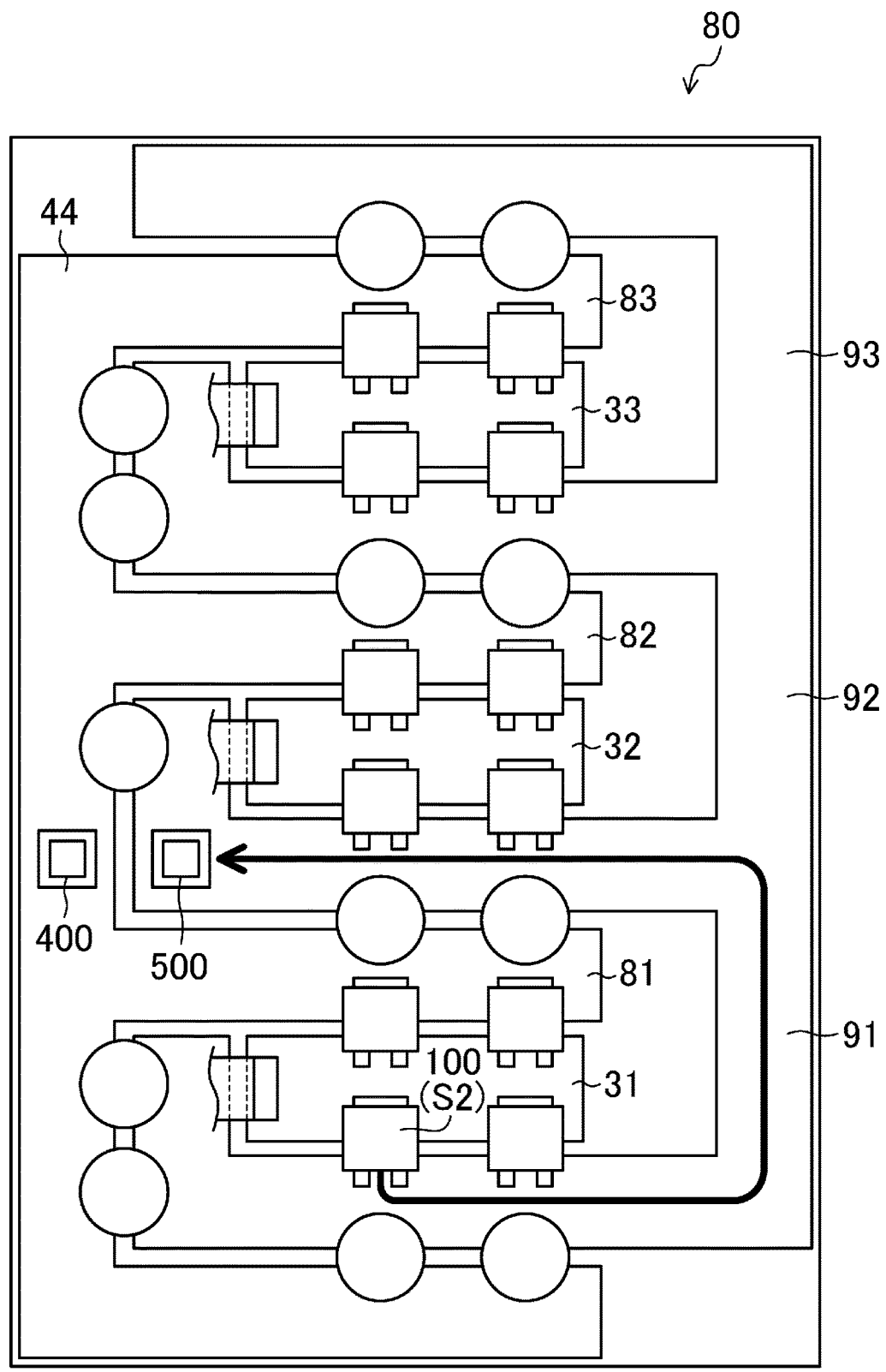
FIG. 5 is a plan view illustrating a current path in a comparative example of the switching power supply device.

FIG. 5 illustrates a current path in switching power supply device 80. Switching power supply device 80 is provided with counter regions 81, 82, 83, instead of the counter regions (first counter region 41, second counter region 42, third counter region 43) illustrated in FIG. 2. Each of counter regions 81, 82, 83 extends in first direction X and is connected to interconnection region 44. Furthermore, switching power supply device 80 is provided with discontinuous annular regions 91, 92, 93, instead of the annular regions (first annular region 51, second annular region 52, third annular region 53) illustrated in FIG. 2. Each of discontinuous annular regions 91, 92, 93 is partly discontinuous and surrounds corresponding output region and counter regions.

As illustrated in FIG. 5, in switching power supply device 80, discontinuous annular region 91 is partly discontinuous (in other words, the annular path is not formed continuously). Therefore, for example, a current path from transistors 100 constituting second switching element S2 to second terminal 500 is equivalent to a route (route indicated by a thick line in FIG. 5) that extends counterclockwise from transistors 100 constituting second switching element S2 to second terminal 500 in discontinuous annular region 91.

Figure 6:
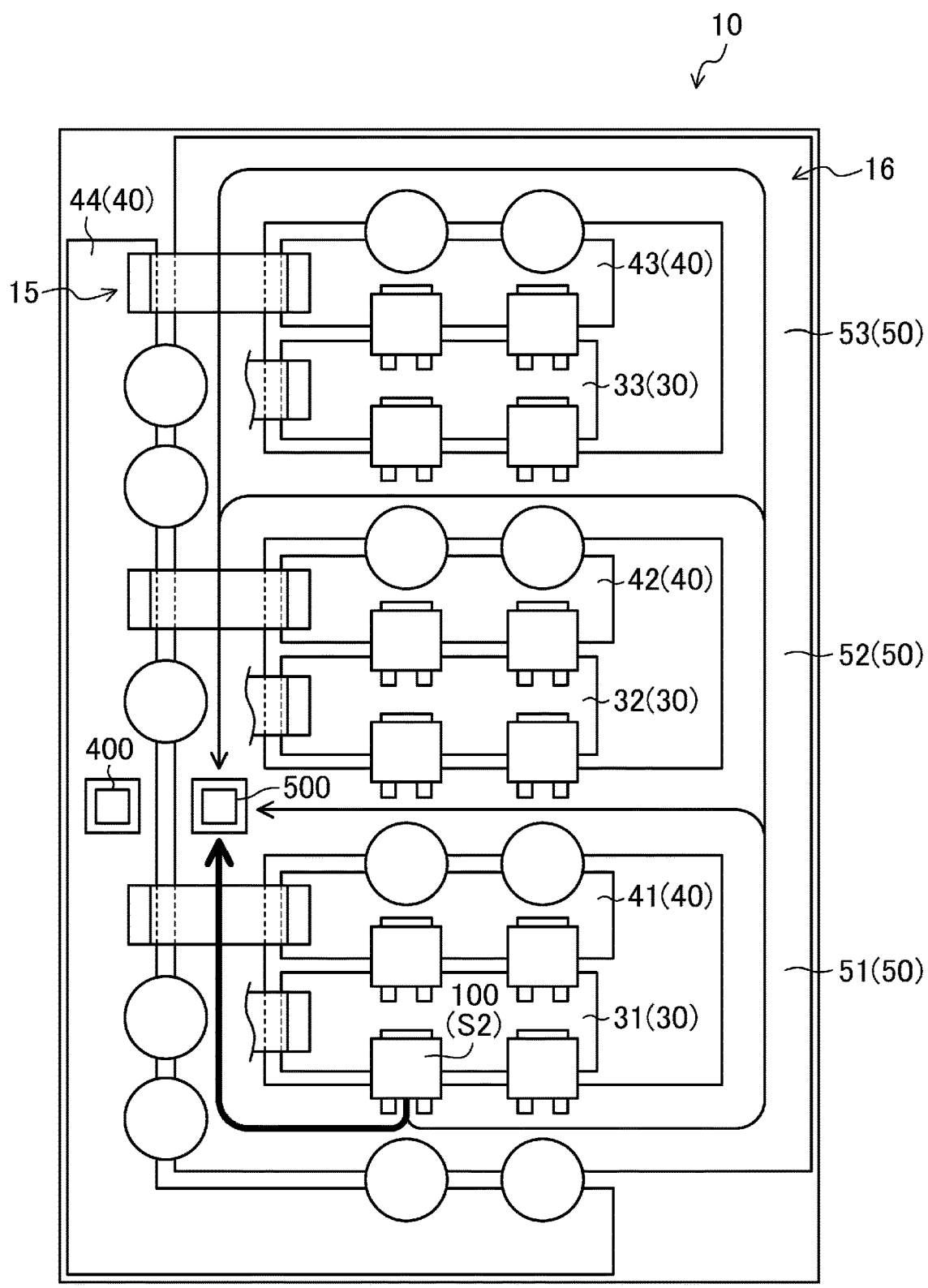
FIG. 6 is a plan view illustrating a current path in the switching power supply device according to the first exemplary embodiment.

In contrast, as illustrated in FIG. 6, in switching power supply device 10 according to the first exemplary embodiment, first annular region 51 is formed so as to continuously surround both first output region 31 and first counter region 41 (in other words, the annular path is continuously formed). Therefore, a current path from transistors 100 constituting second switching element S2 to second terminal 500 is equivalent to a route (route indicated by a thick line in FIG. 6) that extends clockwise from transistors 100 constituting second switching element S2 to second terminal 500 in first annular region 51. In this case, the route indicated by the thick line in FIG. 5 is longer than the route indicated by the thick line in FIG. 6. Thus, the current path between transistors 100 (in second switching element S2) and second terminal 500 in switching power supply device 10 according to the first exemplary embodiment are shorter than the current path between transistors 100 (in second switching element S2) and second terminal 500 in switching power supply device 80 (comparative example) illustrated in FIG. 5.

Moreover, in switching power supply device 10 according to the first exemplary embodiment, first annular region 51, second annular region 52, and third annular region 53 form the continuous annular shape. Therefore, parts of the electric current can flow through paths indicated by thin lines in FIG. 6. In short, a plurality of current paths are formed in parallel to one another between transistors 100 constituting second switching element S2 and second terminal 500. As a result, a resistance value of the current paths between second terminal 500 and transistors 100 constituting second switching element S2 (which is equivalent to a resistance value obtained by summing resistance values of all the current paths as indicated by the thin line and the thick line in FIG. 6) is set to be lower than a resistance value of the current paths between second terminal 500 and transistors 100 constituting second switching element S2 in switching power supply device 80 illustrated in FIG. 5. Thus, a parasitic inductance of the current paths between second terminal 500 and transistors 100 constituting second switching element S2 can be reduced as compared to the case of FIG. 5.

[Effect of First Exemplary Embodiment]

As described above, components constituting switching power supply device 10 (transistors 100 constituting second switching element S2, capacitors 200 constituting smoothing capacitor section 12, and second terminal 500 in this example) are connected to first annular region 51 (continuous annular path) that continuously surrounds both first output region 31 and first counter region 41. This configuration can improve the degree of freedom of selecting a current path (shortest current path) between these components. Consequently, it is possible to shorten the current paths between the components, thereby successfully reducing parasitic inductances of the current paths between these components. Therefore, it is possible to reduce surge voltages (for example, surge voltages caused by switching operations of the switching elements) applied to the components constituting switching power supply device 10.

By forming first output connection member 301 into a planar shape, heat (for example, heat generated by the switching operations of switching elements S1 and S2) transmitted to first output region 31 can be radiated through first output connection member 301. This configuration can improve a heat dissipation property of switching power supply device 10. The effect produced by first output connection member 301 is also applicable to effects produced by second output connection member 302 and by third output connection member 303.

By forming first conductive path 401 from a conductive member having a planar shape, heat (for example, heat generated by the switching operation of switching element S1) transmitted to first counter region 41 can be radiated through first conductive path 401. This configuration can improve the heat dissipation property of switching power supply device 10. The effect produced by first conductive path 401 is also applicable to effects produced by second conductive path 402 and by third conductive path 403.

By forming first output region 31 into a rectangular shape and further forming the inner edge of first annular region 51 into a rectangular shape (namely, in conformity with the shape of first output region 31), a dead space can be reduced between first output region 31 and first annular region 51. The effect produced by a combination of first output region 31 and first annular region 51 is also applicable to effects produced by a combination of second output region 32 and second annular region 52 and by a combination of third output region 33 and third annular region 53.

First annular region 51 and second annular region 52 are formed such that portions located between first output region 31 and second output region 32 are continuous. Likewise, second annular region 52 and third annular region 53 are formed such that portions located between second output region 32 and third output region 33 are continuous. In this way, first annular region 51, second annular region 52, and third annular region 53 can form the continuous annular shape (shape of interconnected rings). This configuration can improve the degree of freedom of selecting a current path between components (transistors 100 constituting second switching element S2, fourth switching element S4, and sixth switching element S6, capacitors 200 constituting smoothing capacitor section 12, and second terminal 500 in this example) provided in first annular region 51, second annular region 52, and third annular region 53. Consequently, it is possible to further shorten the current paths between these components, thereby successfully reducing parasitic inductances of the current paths between the components.

By forming the continuous annular shape from first annular region 51, second annular region 52, and third annular region 53, dead spaces can be reduced between first annular region 51 and second annular region 52 and between second annular region 52 and third annular region 53.

Moreover, by constituting the continuous annular shape from first annular region 51, second annular region 52, and third annular region 53, a plurality of current paths can be formed in parallel to one another between the components provided in first annular region 51, second annular region 52, and third annular region 53. Consequently, it is possible to further reduce parasitic inductances of current paths between these components.

Since first terminal 400 is disposed adjacent to second terminal 500, magnetic fields generated by electric currents flowing through first terminal 400 and second terminal 500 weaken each other. This configuration can reduce an inductance (total inductance) of first terminal 400 and second terminal 500.

Capacitors 200 constituting smoothing capacitor section 12 are provided in conductive layer 22 (more specifically, connected to first conductor pattern 40 and to second conductor pattern 50). This configuration enables current paths between capacitors 200 and transistors 100 constituting first switching element S1 (or second switching element S2) to be shorter than the current paths formed when no capacitors 200 are provided in conductive layer 22 (for example, when capacitor 200 is provided in a substrate independent of substrate 20). Consequently, it is possible to reduce parasitic inductances of current paths between transistors 100 and capacitors 200, thereby successfully lowering surge voltages caused by the switching operation of first switching element S1 (or second switching element S2).

By forming smoothing capacitor section 12 from the plurality of capacitors 200, heat generated by the plurality of capacitors 200 can be dispersed. This configuration can reduce non-uniformity of temperature of switching power supply device 10. For example, it is possible to prevent smoothing capacitor section 12 from being overheated, by suppressing concentration of heat in smoothing capacitor section 12.

By forming first switching element S1 from the plurality of transistors 100, heat generated by the plurality of transistors 100 (for example, heat generated by the switching operation) can be dispersed. This configuration can reduce non-uniformity of temperature of switching power supply device 10. For example, it is possible to prevent first switching element S1 from being overheated, by suppressing a concentration of heat in first switching element S1. The effect produced by first switching element S1 is also applicable to second switching element S2 to sixth switching element S6.

By disposing capacitors 200 constituting smoothing capacitor section 12 adjacent to transistors 100 constituting first switching element S1, the current paths can be shortened between transistors 100 and capacitors 200. This configuration can reduce surge voltages caused by the switching operation of first switching element S1 (more specifically, transistors 100). This effect is also applicable to effects produced by capacitors 200 disposed adjacent to transistors 100 constituting second switching element S2 to sixth switching element S6.

The semiconductor device disclosed in PTL 1 (Unexamined Japanese Patent Publication No. 2004-229393) may involve a cost associated with forming of the loop conductor (for example, a cost associated with forming of a projection in the loop conductor). In the semiconductor device of PTL 1, the forming of the loop conductor may make a thickness of an insulating resin (insulating layer) non-uniform. The non-uniform thickness of the insulating layer might result in non-uniform heat dissipation. In contrast, in switching power supply device 10 according to the first exemplary embodiment, insulating layer 21 can be formed such that its thickness becomes uniform (the non-uniformity of the thickness is reduced). Thus, it is possible to reduce non-uniformity of heat dissipation which may be caused by a non-uniform thickness of insulating layer 21.

Second Exemplary Embodiment

Figure 7:
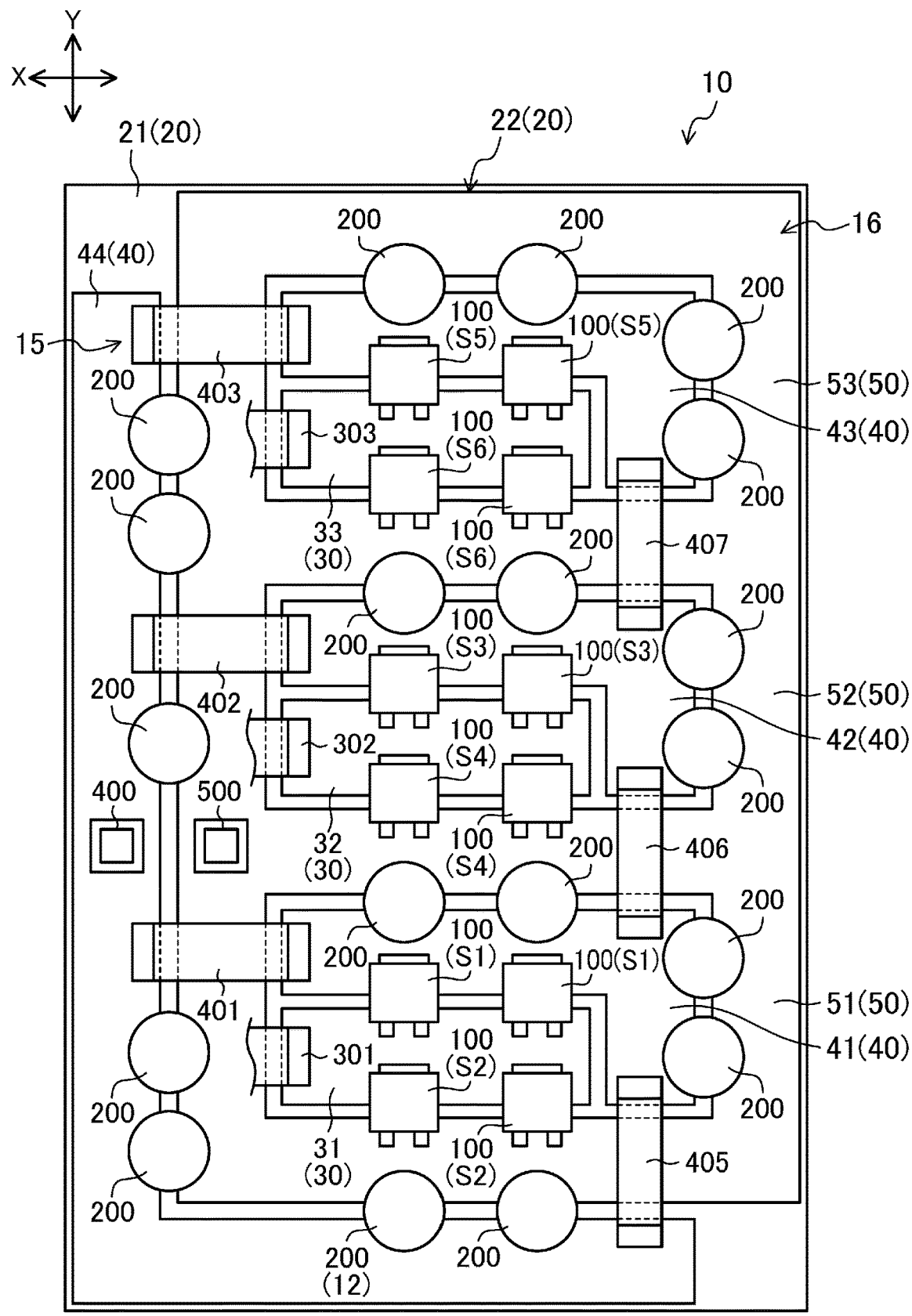
FIG. 7 is a plan view illustrating a structure of a switching power supply device according to a second exemplary embodiment.

FIG. 7 illustrates a structure of switching power supply device 10 according to a second exemplary embodiment. Switching power supply device 10 according to the second exemplary embodiment includes first auxiliary conductive path 405, second auxiliary conductive path 406, and third auxiliary conductive path 407, in addition to the components in switching power supply device 10 according to the first exemplary embodiment illustrated in FIG. 2.

In this example, first counter region 41 is formed in an L shape and has a first extending part and a second extending part. The first extending part extends in first direction X so as to be along first output region 31. The second extending part extends in second direction Y so as to be along first output region 31. The first extending part of first counter region 41 has one end (left end in FIG. 7) connected to first conductive path 401. From the other end (right end in FIG. 7) of the first extending part of first counter region 41, the second extending part of first counter region 41 extends in second direction Y. The configuration (shape) of first counter region 41 is similar to configurations (shapes) of second counter region 42 and third counter region 43. One end of a first extending part of second counter region 42 is connected to second conductive path 402; one end of a first extending part of third counter region 43 is connected to third conductive path 403.

[Auxiliary Conductive Path]

First auxiliary conductive path 405 is disposed at a position different from the position of first conductive path 401. First auxiliary conductive path 405 extends between interconnection region 44 and first counter region 41 over a portion of first annular region 51, thereby connecting interconnection region 44 to first counter region 41. Second auxiliary conductive path 406 extends between first counter region 41 and second counter region 42 over portions of first annular region 51 and second annular region 52, thereby connecting first counter region 41 to second counter region 42. Third auxiliary conductive path 407 extends between second counter region 42 and third counter region 43 over portions of second annular region 52 and third annular region 53, thereby connecting second counter region 42 to third counter region 43. In this example, first auxiliary conductive path 405, second auxiliary conductive path 406, and third auxiliary conductive path 407 extend in second direction Y in a planar view.

Each of first auxiliary conductive path 405, second auxiliary conductive path 406, and third auxiliary conductive path 407 is formed of a conductive member (bus bar) having a planar shape. The conductive member of each of first auxiliary conductive path 405 to third auxiliary conductive path 407 has a configuration similar to a configuration of the conductive member of first conductive path 401 illustrated in FIG. 4. The conductive member of first auxiliary conductive path 405 is bonded at one end to interconnection region 44 with soldering and at the other end to an end (lower end in FIG. 7) of the second extending part of first counter region 41 with soldering. The conductive member of second auxiliary conductive path 406 is bonded at one end to the other end (upper end in FIG. 7) of the second extending part of first counter region 41 with soldering and at the other end to an end (lower end in FIG. 7) of the second extending part of second counter region 42 with soldering. The conductive member of third auxiliary conductive path 407 is bonded at one end to the other end (upper end in FIG. 7) of the second extending part of second counter region 42 with soldering and at the other end to an end (lower end in FIG. 7) of the second extending part of third counter region 43 with soldering.

[Conductor Paths]

In the second exemplary embodiment, both of first conductor path 15 and second conductor path 16 have respective continuous annular paths. More specifically, first conductor path 15 includes first conductor patterns 40 (first counter region 41 to third counter region 43, and interconnection region 44), first conductive path 401 to third conductive path 403, and first auxiliary conductive path 405 to third auxiliary conductive path 407. Second conductor path 16 includes second conductor pattern 50 (first annular region 51, second annular region 52, and third annular region 53).

[Smoothing Capacitor Section]

In the second exemplary embodiment, smoothing capacitor section 12 includes nineteen capacitors 200. These nineteen capacitors 200 include: in addition to thirteen capacitors 200 illustrated in FIG. 2, two capacitors 200 mounted on surfaces of first counter region 41 and first annular region 51; two capacitors 200 mounted on surfaces of second counter region 42 and second annular region 52; and two capacitors 200 mounted on surfaces of third counter region 43 and third annular region 53.

[Effect of Second Exemplary Embodiment]

As described above, first counter region 41 is connected to interconnection region 44 via first conductive path 401 and first auxiliary conductive path 405. In this way, first counter region 41, interconnection region 44, first conductive path 401, and first auxiliary conductive path 405 can be disposed in an annular manner (namely, a discontinuous annular path can be formed). This configuration can improve the degree of freedom of selecting a current path (shortest current path) between components (transistors 100 constituting first switching element S1, capacitors 200 constituting smoothing capacitor section 12, and first terminal 400 in this example) provided in first counter region 41 and interconnection region 44. Consequently, it is possible to shorten the current paths between the components, thereby successfully reducing parasitic inductances of the current paths between these components.

First counter region 41 to third counter region 43 are connected to interconnection region 44 via first conductive path 401 to third conductive path 403 and first auxiliary conductive path 405. First counter region 41 is connected to second counter region 42 via second auxiliary conductive path 406. Second counter region 42 is connected to third counter region 43 via third auxiliary conductive path 407. This configuration enables first counter region 41 to third counter region 43, interconnection region 44, first conductive path 401 to third conductive path 403, and first auxiliary conductive path 405 to third auxiliary conductive path 407 to form a continuous annular shape (shape of interconnected rings). This configuration can improve the degree of freedom of selecting a current path (shortest current path) between components (transistors 100 constituting first switching element S1, third switching element S3, fifth switching element S5, capacitors 200 constituting smoothing capacitor section 12, and first terminal 400 in this example) provided in first counter region 41 to third counter region 43 and interconnection region 44. Consequently, it is possible to shorten the current paths between the components, thereby successfully reducing parasitic inductances of the current paths between these components.

The continuous annular shape is formed of first counter region 41 to third counter region 43, interconnection region 44, first conductive path 401 to third conductive path 403, and first auxiliary conductive path 405 to third auxiliary conductive path 407. In this way, a plurality of current paths can be formed between components disposed within first counter region 41 to third counter region 43, and interconnection region 44. This configuration can further reduce the parasitic inductances of the current paths between these components.

(First Modification of Connection Structure of Connection Member)

In switching power supply device 10, the conductive members (collectively referred to as the "connection members") that constitute first output connection member 301 to third output connection member 303, first conductive path 401 to third conductive path 403, first auxiliary conductive path 405 to third auxiliary conductive path 407, and a power line (not illustrated) connected to first terminal 400 and to second terminal 500 may be connected to conductive layer 22 in a manner described below.

Figure 8:
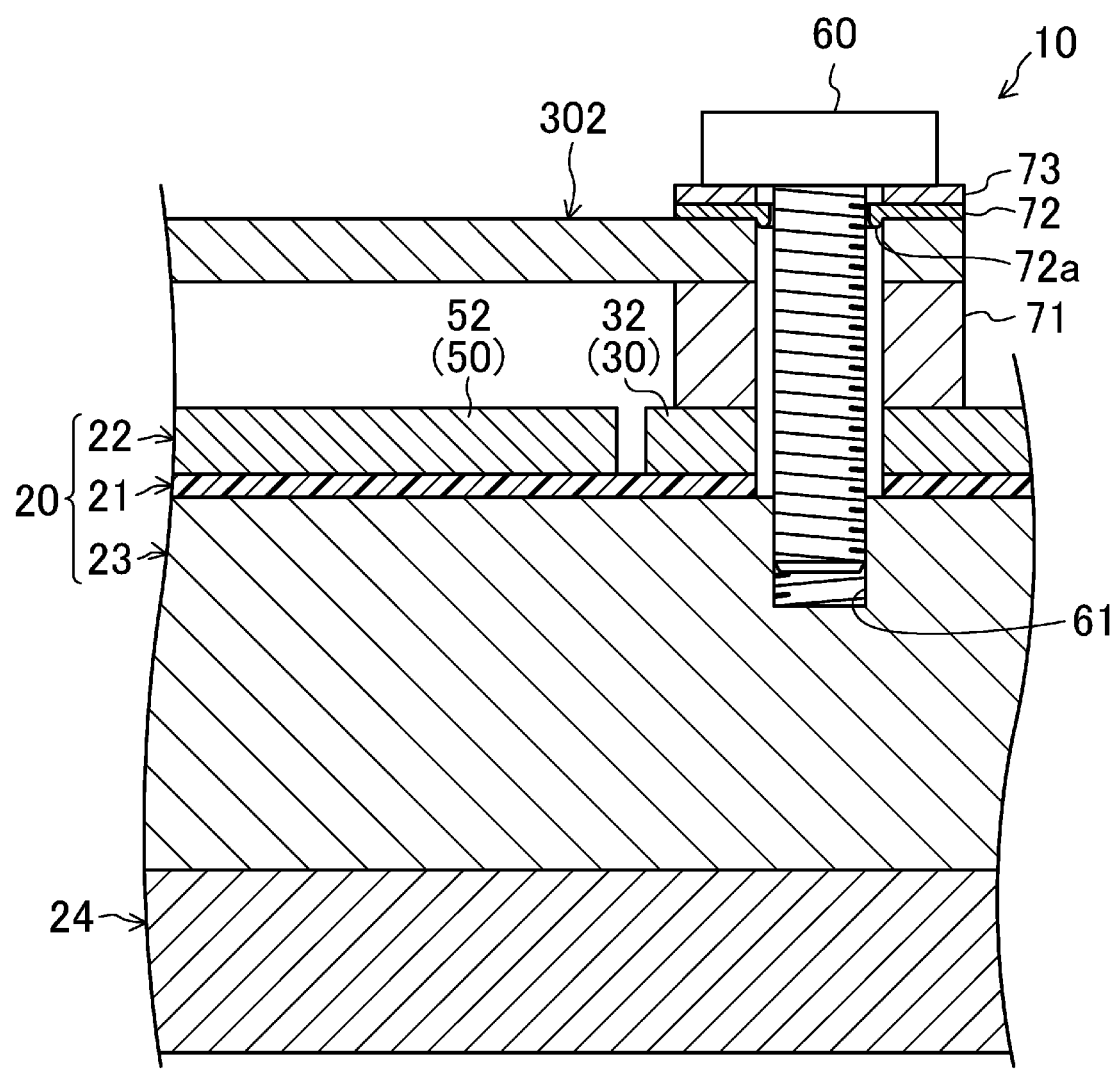
FIG. 8 is a cross-sectional view illustrating a first modification of a connection structure of the connection member.
Figure 9:
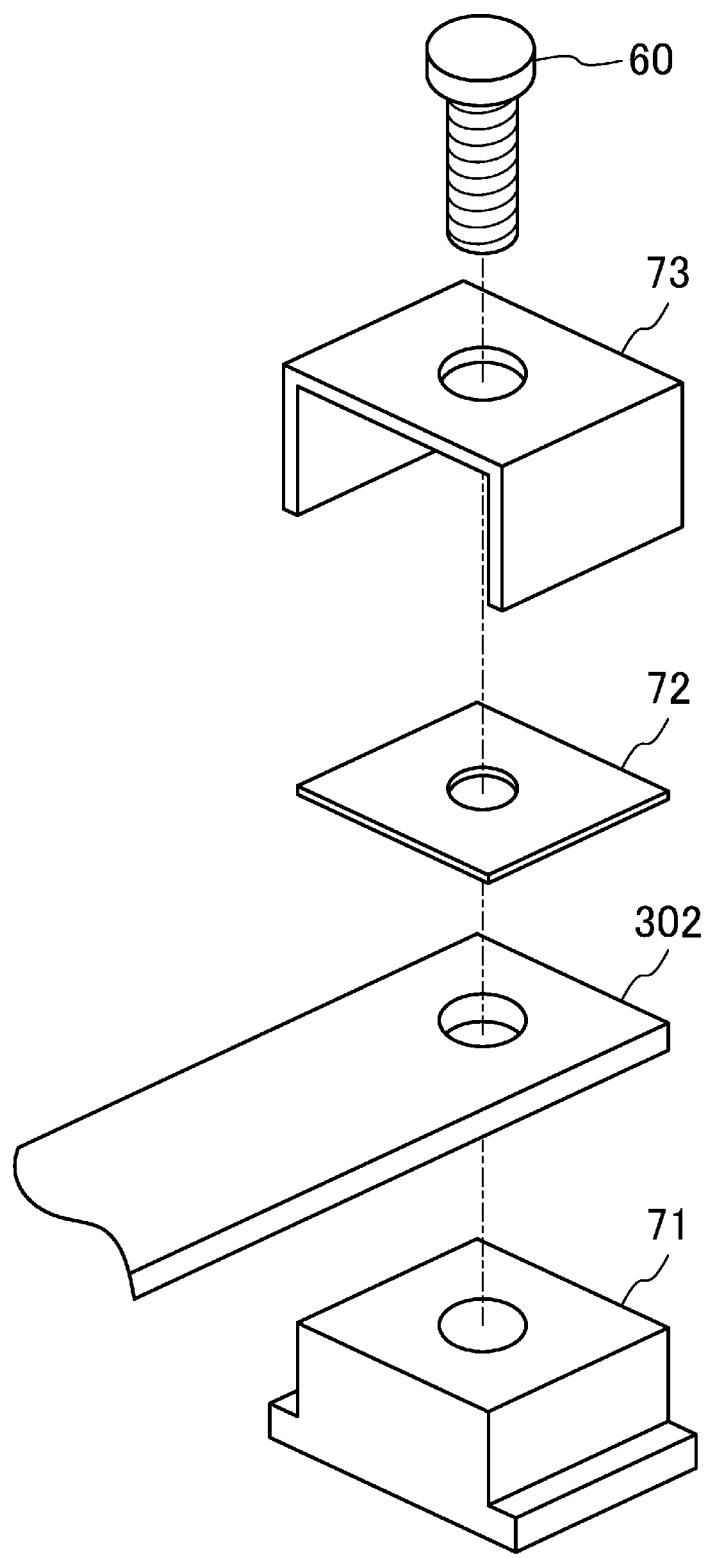
FIG. 9 is an exploded perspective view illustrating the first modification of the connection structure of the connection member.

FIGS. 8 and 9 each illustrate an example of a connection structure of connection members. Further, FIGS. 8 and 9 each illustrate an example of a connection structure between second output connection member 302 and second output region 32. In this example, second output connection member 302 is secured to second output region 32 by coupling screw 60 that penetrates conductive layer 22 and insulating layer 21 and is fixed to heat dissipation layer 23. In short, this connection structure is a structure in which second output connection member 302 is secured to substrate 20 (more specifically, heat dissipation layer 23) by coupling screw 60. The connection structure includes mount 71, insulating member 72, washer 73, and coupling screw 60.

Mount 71, made of a conductive material (for example, metal), is provided on conductive layer 22. More specifically, mount 71 is provided in a connection part between second output connection member 302 and conductive layer 22 (the connection part corresponds to a part to which the connection member is connected, namely, second output region 32 in the example of FIG. 8).

In this example, mount 71 has a mounting surface (upper surface in FIG. 8) formed in a rectangular shape. Provided at a center of mount 71 is an insertion hole through which coupling screw 60 passes. The insertion hole of mount 71 has a larger diameter than an outer diameter of a threaded portion of coupling screw 60.

Mounted on the mounting surface of mount 71 is second output connection member 302. In this example, second output connection member 302, formed in a planar shape, is mounted on the mounting surface of mount 71. Second output connection member 302 is provided with an insertion hole through which coupling screw 60 passes. The insertion hole in second output connection member 302 has a larger diameter than the outer diameter of the threaded portion of coupling screw 60.

A height (distance between the surface of conductive layer 22 and the mounting surface of mount 71) of mount 71 is set to be greater than a height of components (capacitors 200 in this example) provided in conductive layer 22. This configuration can prevent second output connection member 302 mounted on the mounting surface of mount 71 from making contact with the components provided in conductive layer 22.

Insulating member 72, formed in a planar shape, is mounted on second output connection member 302, which is mounted on mount 71. For example, insulating member 72 may be made of an insulating paper (a high-quality paper or craft paper coated with an insulating varnish). In this example, insulating member 72 is formed in conformity with a planar shape of the mounting surface of mount 71 (namely, formed in a rectangular shape). Provided at a center of insulating member 72 is an insertion hole through which coupling screw 60 passes. A diameter of the insertion hole in insulating member 72 is larger than the outer diameter of the threaded portion of coupling screw 60 but smaller than the diameter of the insertion holes in second output connection member 302 and in mount 71. Insulating member 72 is provided with annular projection 72a on its inner circumferential portion, which is positioned around the insertion hole. For example, annular projection 72a may be formed by embossing the inner circumferential portion of insulating member 72 which is positioned around an insertion hole.

Washer 73, formed in a planar shape, is mounted on insulating member 72, which is mounted on second output connection member 302. In this example, washer 73 is formed in a planar, U shape (a plate shape bent in a U shape). Washer 73 is configured so as to cover mount 71, with second output connection member 302 and insulating member 72 disposed between washer 73 and the mounting surface of mount 71. Provided at a center of washer 73 is an insertion hole through which coupling screw 60 passes. The insertion hole in washer 73 has a larger diameter than the outer diameter of the threaded portion of coupling screw 60.

Conductive layer 22 and insulating layer 21 in substrate 20 are provided with an insertion hole through which coupling screw 60 passes. A diameter of the insertion hole in conductive layer 22 and insulating layer 21 is larger than the outer diameter of the threaded portion of coupling screw 60 and the diameter of the insertion hole in insulating member 72. Provided in heat dissipation layer 23 of substrate 20 is threaded hole 61 to which coupling screw 60 is fixed.

Coupling screw 60 penetrates washer 73, insulating member 72, second output connection member 302, mount 71, conductive layer 22, and insulating layer 21 and is fixed to heat dissipation layer 23. More specifically, coupling screw 60 passes through the insertion holes in washer 73, insulating member 72, second output connection member 302, mount 71, conductive layer 22, and insulating layer 21 and is fixed to threaded hole 61 in heat dissipation layer 23. In this case, gaps are formed between the threaded portion of coupling screw 60 and second output connection member 302, between the threaded portion of coupling screw 60 and mount 71, and between the threaded portion of coupling screw 60 and the insertion hole in conductive layer 22 and in insulating layer 21. In addition, washer 73 and insulating member 72 are provided between a head of coupling screw 60 and second output connection member 302. This configuration reliably electrically insulates second output connection member 302 from heat dissipation layer 23.

As described above, by using coupling screw 60 that penetrates conductive layer 22 and insulating layer 21 and that is fixed to heat dissipation layer 23, the connection member (second output connection member 302 in the example of FIG. 8) is secured to the connection part (second output region 32 in the example of FIG. 8) of conductive layer 22 by a screw. Contact between insulating layer 21 and heat dissipation layer 23 can be thereby improved. This configuration facilitates heat transmission from transistors 100 to heat dissipation layer 23 via conductive layer 22 and insulating layer 21. As a result, the heat dissipation property of substrate 20 can be improved. Thus, the configuration can suppress a temperature rise caused by the switching operations of transistors 100.

Also, the above configuration improves contact between second output connection member 302 and mount 71 and between mount 71 and conductive layer 22 (second output region 32 in the example of FIG. 8). Thus, heat of transistors 100 is efficiently transferred to second output region 32, mount 71, and second output connection member 302 in this order. As a result, the heat can also be radiated from second output connection member 302. Thus, this configuration can suppress a temperature rise caused by the switching operations of transistors 100.

(Second Modification of Connection Structure of Connection Member)

Figure 10:
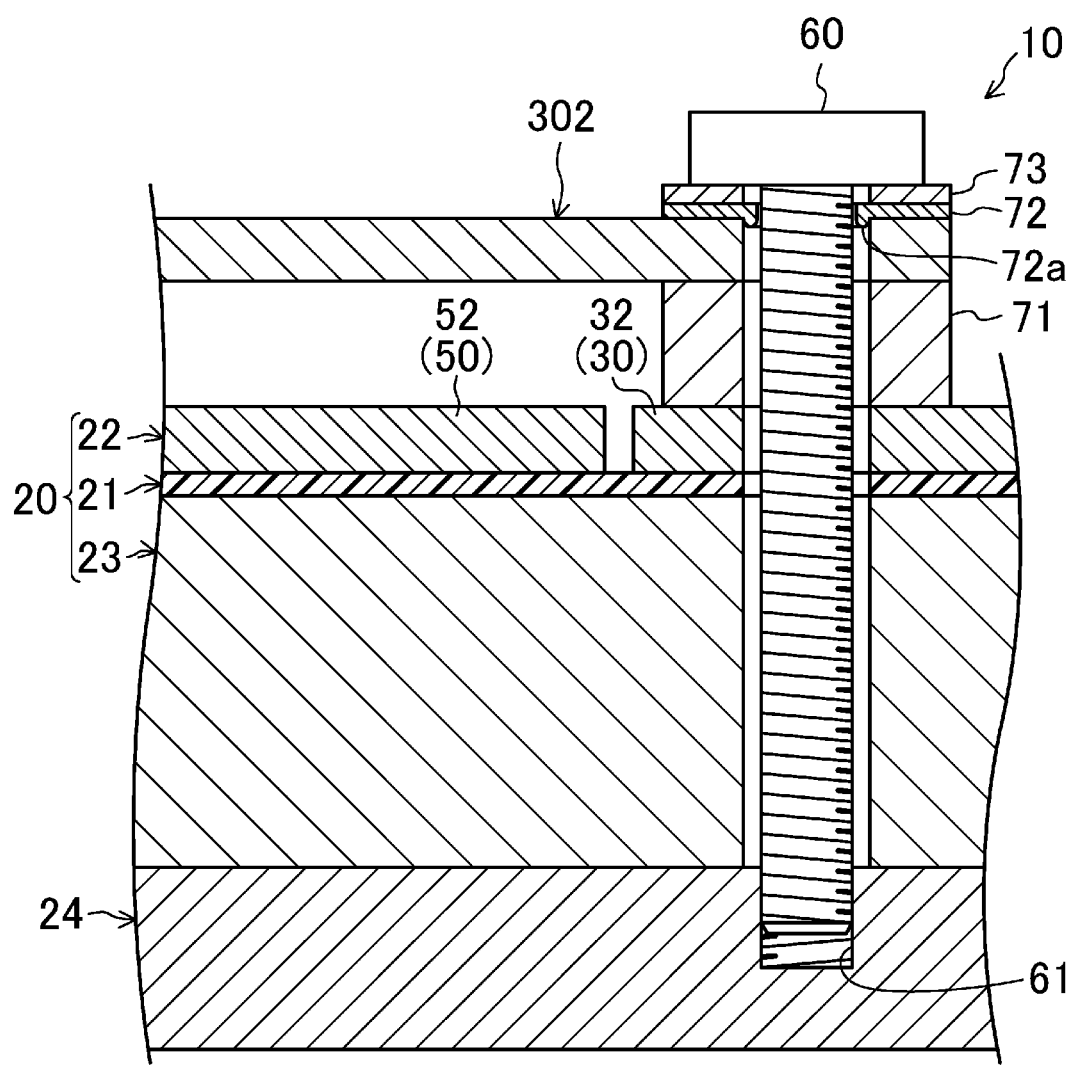
FIG. 10 is a cross-sectional view illustrating a second modification of the connection structure of the connection member.

FIG. 10 is a cross-sectional view illustrating another modification of the connection structure of the connection member. Further, FIG. 10 illustrates an example of the connection structure between second output connection member 302 and second output region 32.

In the example of FIG. 10, coupling screw 60 penetrates conductive layer 22, insulating layer 21, and heat dissipation layer 23 and is fixed to heat dissipation member 24. More specifically, by causing coupling screw 60 to penetrate conductive layer 22, insulating layer 21, and heat dissipation layer 23 so as to be fixed to heat dissipation member 24, second output connection member 302 may be secured to a connection part (second output region 32 in the example of FIG. 10) between second output connection member 302 and conductive layer 22 by a screw.

In the example of FIG. 10, each of conductive layer 22, insulating layer 21, and heat dissipation layer 23 is provided with an insertion hole through which coupling screw 60 passes. Heat dissipation member 24 is provided with threaded hole 61 into which coupling screw 60 is inserted. Coupling screw 60 passes through insertion holes in washer 73, insulating member 72, second output connection member 302, and mount 71 and the insertion holes in conductive layer 22, insulating layer 21, and heat dissipation layer 23. Then, coupling screw 60 is inserted into threaded hole 61 in heat dissipation member 24. In this case, gaps are formed between a threaded portion of coupling screw 60 and second output connection member 302, between the threaded portion of the coupling screw 60 and mount 71, and between the threaded portion of coupling screw 60 and the insertion hole in conductive layer 22, insulating layer 21, and heat dissipation layer 23. In addition, washer 73 and insulating member 72 are provided between a head of coupling screw 60 and second output connection member 302. This configuration reliably electrically insulates second output connection member 302 from heat dissipation member 24.

As described above, by using coupling screw 60 that penetrates conductive layer 22, insulating layer 21, and heat dissipation layer 23 and is fixed to heat dissipation member 24, the connection member (second output connection member 302 in the example of FIG. 10) is secured to the connection part (second output region 32 in the example of FIG. 10) of conductive layer 22 by a screw. Contact between insulating layer 21 and heat dissipation layer 23 and between heat dissipation layer 23 and heat dissipation member 24 can be thereby improved. This configuration facilitates heat transmission from transistors 100 to heat dissipation member 24 via conductive layer 22, insulating layer 21, and heat dissipation layer 23. As a result, the heat dissipation property of substrate 20 can be improved. Thus, the configuration can suppress a temperature rise caused by the switching operations of transistors 100.

Moreover, by using coupling screw 60 that penetrates conductive layer 22, insulating layer 21, and heat dissipation layer 23 and is fixed to heat dissipation member 24, the connection member (second output connection member 302 in the example of FIG. 10) is secured to the connection part (second output region 32 in the example of FIG. 10) of conductive layer 22 by a screw. Warping of substrate 20 can be thereby suppressed. In addition, substrate 20 and heat dissipation member 24 can be fixed to each other by coupling screw 60. This configuration can contribute to a reduced number of components in switching power supply device 10.

It should be noted that the connection structure of the connection member is not limited to any of a configuration in which the connection member is directly soldered to conductive layer 22 and the configurations illustrated in FIGS. 8 to 10. For example, a configuration in which a female-threaded metal pipe is soldered to conductive layer 22 and second output connection member 302 (bus bar) illustrated in FIG. 9 is secured to this female screw by coupling screw 60 may be employed. In this case, a power line having an end connected to a crimping terminal, may be used instead of second output connection member 302 (bus bar). This configuration also enables heat of transistors 100 and other components to be transmitted, in this order, to conductive layer 22, the metal pipe, and connection member (bus bar and power line) and to be radiated from the connection member. The configuration can be made simple, because insulating member 72 and washer 73 are unnecessary.

Third Exemplary Embodiment

Figure 11:
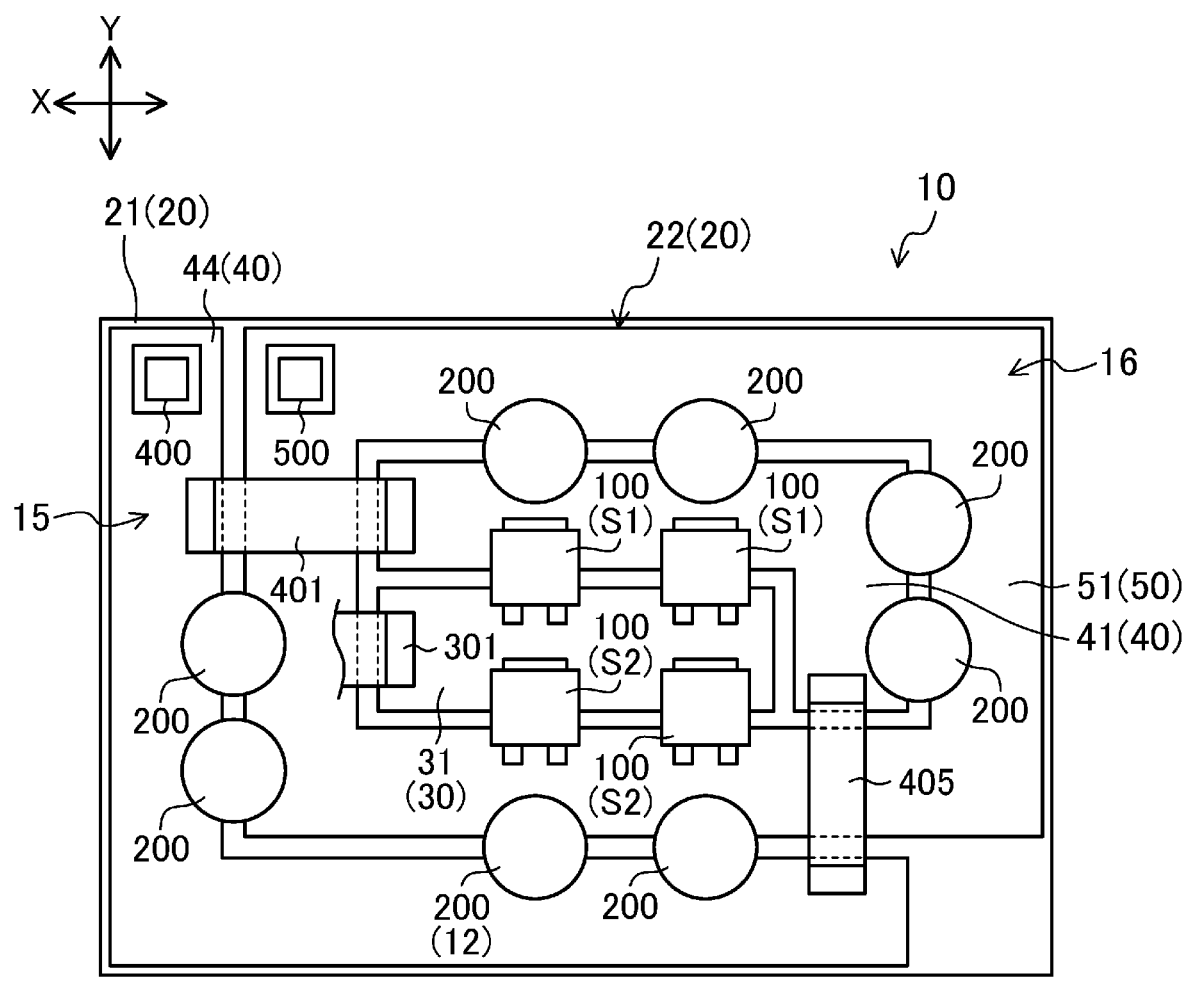
FIG. 11 is a plan view illustrating a structure of a switching power supply device according to a third exemplary embodiment.

FIG. 11 illustrates a structure of switching power supply device 10 according to a third exemplary embodiment. The structure of switching power supply device 10 according to the third exemplary embodiment corresponds to a portion of the structure of switching power supply device 10, illustrated in FIG. 7, according to the second exemplary embodiment. More specifically, switching power supply device 10 according to the third exemplary embodiment includes substrate 20, first switching element S1, second switching element S2, smoothing capacitor section 12, first terminal 400, second terminal 500, first output connection member 301, first conductive path 401, and first auxiliary conductive path 405. For example, switching power supply device 10 may serve as a DC-DC converter. First output connection member 301 may be electrically connected to an inductance (not illustrated).

In the third exemplary embodiment, substrate 20 includes insulating layer 21, conductive layer 22, and heat dissipation layer 23 (not illustrated in FIG. 11). Output pattern 30, first conductor patterns 40, and second conductor pattern 50 are formed in conductive layer 22. Output pattern 30 includes first output region 31; first conductor pattern 40 includes first counter region 41 and interconnection region 44; and second conductor pattern 50 includes first annular region 51.

In the third exemplary embodiment, interconnection region 44 is formed so as to be along first annular region 51. In this example, interconnection region 44 is formed in an L shape and has a first extending part and a second extending part. The first extending part extends in second direction Y so as to be along one edge (left edge in FIG. 11), in first direction X, of first annular region 51. The second extending part extends in first direction X so as to be along one edge (lower edge in FIG. 11), in second direction Y, of first annular region 51.

In the third exemplary embodiment, both of first conductor path 15 and second conductor path 16 have respective continuous annular paths. More specifically, first conductor path 15 includes first conductor patterns 40 (first counter region 41), first conductive path 401, and first auxiliary conductive path 405). Second conductor path 16 includes second conductor pattern 50 (first annular region 51).

In the third exemplary embodiment, second terminal 500 is disposed within first annular region 51. In this example, second terminal 500 is disposed on one edge part (left edge part in FIG. 11), in first direction X, of first annular region 51, whereas first terminal 400 is disposed within the first extending part of interconnection region 44 (portion extending in second direction Y) so as to face (be adjacent to) second terminal 500 in first direction X.

In the third exemplary embodiment, smoothing capacitor section 12 includes a plurality of (eight in this example) capacitors 200. These eight capacitors 200 include: two capacitors 200 related to first switching element S1; two capacitors 200 related to second switching element S2; two capacitors 200 mounted on surfaces of the first extending part (portion extending in second direction Y) of interconnection region 44 and first annular region 51; and two capacitors 200 mounted on a surface of first counter region 41 and the surface of first annular region 51.

The remaining configuration of switching power supply device 10 according to the third exemplary embodiment is similar to the configuration of switching power supply device 10 according to the second exemplary embodiment.

[Effect of Third Exemplary Embodiment]

Switching power supply device 10 according to the third exemplary embodiment can produce substantially the same effect as the effect of switching power supply devices 10 according to the first and second exemplary embodiments. For example, first annular region 51 is connected to components (transistors 100 constituting second switching element S2, capacitors 200 constituting smoothing capacitor section 12, and second terminal 500 in this example) constituting switching power supply device 10. This configuration can improve the degree of freedom of selecting a current path (shortest current path) between these components. Consequently, it is possible to shorten the current paths between the components, thereby successfully reducing parasitic inductances of the current paths between these components.

Fourth Exemplary Embodiment

Figure 12:
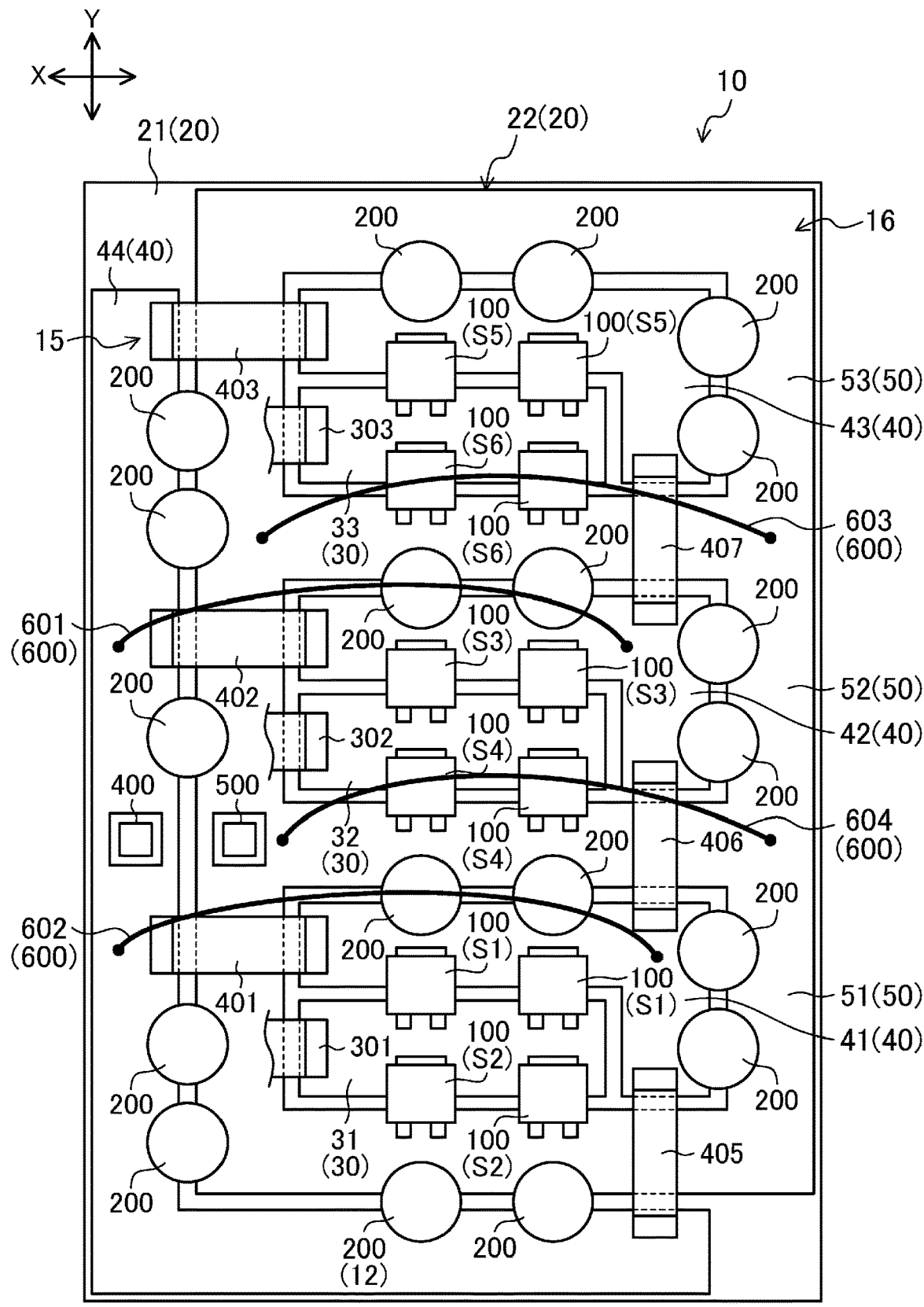
FIG. 12 is a plan view illustrating a structure of a switching power supply device according to a fourth exemplary embodiment.

FIG. 12 illustrates a configuration of switching power supply device 10 according to a fourth exemplary embodiment. Switching power supply device 10 according to the fourth exemplary embodiment includes one or more (four in this example) parallel conductive paths 600 in addition to the components in switching power supply device 10 according to the second exemplary embodiment illustrated in FIG. 7. Parallel conductive paths 600 are connected in parallel to first conductor path 15 or second conductor path 16. As one example, each of parallel conductive paths 600 may be formed of a conductive wire. As another example, each of parallel conductive paths 600 may be formed of a conductive member (bus bar) having a planar shape.

In this example, switching power supply device 10 is provided with first parallel conductive path 601 to fourth parallel conductive path 604. First parallel conductive path 601 electrically connects interconnection region 44 to second counter region 42. Second parallel conductive path 602 electrically connects interconnection region 44 to first counter region 41. Third parallel conductive path 603 electrically connects one end and the other end, in first direction X, (left and right ends in FIG. 12) of a continuous portion of second annular region 52 and third annular region 53. Fourth parallel conductive path 604 electrically connects one end and the other end, in first direction X, (left and right ends in FIG. 12) of a continuous portion of first annular region 51 and second annular region 52.

[Effect of Fourth Exemplary Embodiment]

As described above, parallel conductive paths 600 are connected in parallel to first conductor path 15 (or second conductor path 16). This configuration can reduce a local concentration of electric current in first conductor path 15 (or second conductor path 16).

Fifth Exemplary Embodiment

Figure 13:
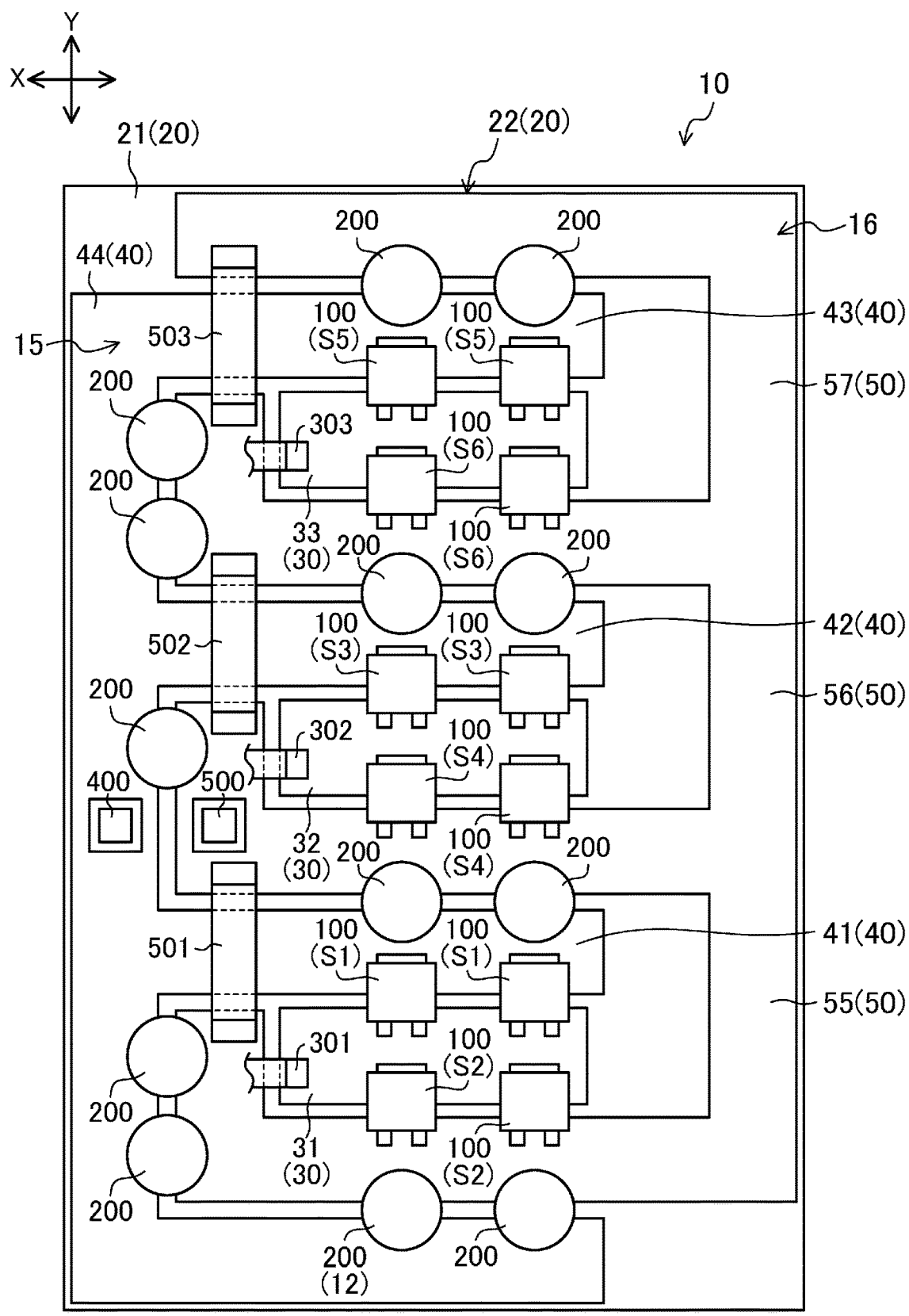
FIG. 13 is a plan view illustrating a structure of a switching power supply device according to a fifth exemplary embodiment.

FIG. 13 illustrates a configuration of switching power supply device 10 according to a fifth exemplary embodiment. In switching power supply device 10 according to the fifth exemplary embodiment, first conductor pattern 40 and second conductor pattern 50 have configurations different from the configurations of first conductor pattern 40 and second conductor pattern 50 in switching power supply device 10 according to the first exemplary embodiment illustrated in FIG. 2. Switching power supply device 10 according to the fifth exemplary embodiment includes first connection conductive path 501, second connection conductive path 502, and third connection conductive path 503, instead of first conductive path 401 to third conductive path 403 illustrated in FIG. 2.

[First Conductor Patterns]

In the fifth exemplary embodiment, first conductor pattern 40 includes first counter region 41, second counter region 42, third counter region 43 and interconnection region 44, similar to first conductor patterns 40 in the first exemplary embodiment.

In the fifth exemplary embodiment, interconnection region 44 is connected to first counter region 41 to third counter region 43. In the fifth exemplary embodiment, interconnection region 44 and first counter region 41 to third counter region 43 forms an E shape. It should be noted that the remaining configurations of first counter region 41 to third counter region 43 in the fifth exemplary embodiment are similar to the configuration of first counter region 41 to third counter region 43 in the first exemplary embodiment. In addition, a configuration of interconnection region 44 in the fifth exemplary embodiment is also similar to the configuration of interconnection region 44 in the first exemplary embodiment.

[Second Conductor Pattern]

In the fifth exemplary embodiment, second conductor pattern 50 includes first surrounding region 55, second surrounding region 56, and third surrounding region 57, instead of first annular region 51 to third annular region 53.

First surrounding region 55 is formed so as to surround both first output region 31 and first counter region 41. In addition, first surrounding region 55 has a dead-end portion. In this example, first counter region 41 extends beyond the dead-end portion of first surrounding region 55.

Second surrounding region 56 is formed so as to surround both second output region 32 and second counter region 42. In addition, second surrounding region 56 has a dead-end portion. In this example, second counter region 42 extends beyond the dead-end portion of second surrounding region 56.

Third surrounding region 57 is formed so as to surround both third output region 33 and third counter region 43. In addition, third surrounding region 57 has a dead-end portion. In this example, third counter region 43 extends beyond the dead-end portion of third surrounding region 57.

In this example, first surrounding region 55 and second surrounding region 56 are formed such that portions (more specifically, the portions located between first output region 31 and second output region 32) of first surrounding region 55 and second surrounding region 56 are continuous. Likewise, second surrounding region 56 and third surrounding region 57 are formed such that portions (portions located between second output region 32 and third output region 33) of second surrounding region 56 and third surrounding region 57 are continuous.

In this example, first surrounding region 55, second surrounding region 56, and third surrounding region 57 are formed such that their inner and outer edges each have a rectangular shape. In short, each of first surrounding region 55, second surrounding region 56, and third surrounding region 57 is formed in a shape of a rectangular frame.

[Connection Conductive Paths]

First connection conductive path 501 joins the dead-end portion of first surrounding region 55 so as to form an annular path that continuously surrounds first output region 31. In this example, first connection conductive path 501 is formed so as to extend in second direction Y in a planar view, and joins the dead-end portion of first surrounding region 55 by extending over a portion (portion located near the dead-end portion of first surrounding region 55) of first counter region 41.

Second connection conductive path 502 joins the dead-end portion of second surrounding region 56 so as to form an annular path that continuously surrounds second output region 32. In this example, second connection conductive path 502 is formed so as to extend in second direction Y in a planar view, and joins the dead-end portion of second surrounding region 56 by extending over a portion (portion located near the dead-end portion of second surrounding region 56) of second counter region 42.

Third connection conductive path 503 joins the dead-end portion of third surrounding region 57 so as to form an annular path that continuously surrounds third output region 33. In this example, third connection conductive path 503 is formed so as to extend in second direction Y in a planar view, and joins the dead-end portion of third surrounding region 57 by extending over a portion (portion located near the dead-end portion of third surrounding region 57) of third counter region 43.

In the fifth exemplary embodiment, the dead-end portions of first surrounding region 55 to third surrounding region 57 are joined by first connection conductive path 501 to third connection conductive path 503. As a result, first surrounding region 55 to third surrounding region 57 and first connection conductive path 501 to third connection conductive path 503 form a continuous annular region (region having a shape of interconnected rings, namely, the shape of three rectangles interconnected in series).

In the fifth exemplary embodiment, each of first connection conductive path 501, second connection conductive path 502, and third connection conductive path 503 is formed of a conductive member (bus bar) having a planar shape. The conductive member of each of first connection conductive path 501 to third connection conductive path 503 has a configuration similar to a configuration of the conductive member of first conductive path 401 illustrated in FIG. 4. Both ends of the conductive member of first connection conductive path 501 are bonded to first surrounding region 55 with soldering. Likewise, both ends of the conductive member of second connection conductive path 502 (or third connection conductive path 503) are bonded to second surrounding region 56 (or third surrounding region 57) with soldering.

[Terminals]

In the fifth exemplary embodiment, first terminal 400 and second terminal 500 are disposed adjacent to each other, similar to first terminal 400 and second terminal 500 in the first exemplary embodiment. Second terminal 500 is disposed within second surrounding region 56 of second conductor pattern 50. The remaining configuration of second terminal 500 in the fifth exemplary embodiment is similar to the configuration of second terminal 500 in the first exemplary embodiment. Likewise, the remaining configuration of first terminal 400 in the fifth exemplary embodiment is similar to the configuration of first terminal 400 in the first exemplary embodiment.

(Switching Elements)

In the fifth exemplary embodiment, second switching element S2, fourth switching element S4, sixth switching element S6 are connected to first surrounding region 55 to third surrounding region 57, instead of first annular region 51 to third annular region 53 illustrated in FIG. 2. It should be noted that the remaining configurations of second switching element S2, fourth switching element S4, and sixth switching element S6 in the fifth exemplary embodiment are similar to the configurations of second switching element S2, fourth switching element S4, and sixth switching element S6 in the first exemplary embodiment. Likewise, configurations of first switching element S1, third switching element S3, and fifth switching element S5 in the fifth exemplary embodiment are similar to the configurations of first switching element S1, third switching element S3, and fifth switching element S5 in the first exemplary embodiment.

[Smoothing Capacitor Section]

A plurality of capacitors 200 constituting smoothing capacitor section 12 are connected to first surrounding region 55 (or second surrounding region 56, third surrounding region 57), instead of first annular region 51 (or second annular region 52, third annular region 53) illustrated in FIG. 2. The remaining configuration of the plurality of capacitors 200 in the fifth exemplary embodiment is similar to the configuration of the plurality of capacitors 200 in the first exemplary embodiment.

[Conductor Paths]

In the fifth exemplary embodiment, of first conductor path 15 and second conductor path 16, second conductor path 16 has a continuous annular path. More specifically, first conductor path 15 includes first conductor patterns 40 (first counter region 41, second counter region 42, third counter region 43, and interconnection region 44). Second conductor path 16 includes second conductor patterns 50 (first surrounding region 55 to third surrounding region 57) and first connection conductive path 501 to third connection conductive path 503.

[Effect of Fifth Exemplary Embodiment]

As described above, first surrounding region 55 (namely, the continuous annular path) with its dead-end portion joined by first connection conductive path 501 is connected to components constituting switching power supply device 10 (transistors 100 constituting second switching element S2, capacitors 200 constituting smoothing capacitor section 12, and second terminal 500 in this example). This configuration can improve the degree of freedom of selecting a current path (shortest current path) between these components. Consequently, it is possible to shorten the current paths between the components, thereby successfully reducing parasitic inductances of the current paths between these components. Therefore, it is possible to reduce surge voltages (for example, surge voltages caused by switching operations of the switching elements) applied to the components constituting switching power supply device 10.

By forming first connection conductive path 501 from a conductive member having a planar shape, heat (for example, heat generated by a switching operation of second switching element S2) transmitted to first surrounding region 55 can be radiated through first connection conductive path 501. This configuration can improve the heat dissipation property of switching power supply device 10. The effect produced by first connection conductive path 501 is also applicable to effects produced by second connection conductive path 502 and by third connection conductive path 503.

By forming first output region 31 into a rectangular shape and further forming the inner edge of first surrounding region 55 into a rectangular shape (namely, in conformity with the shape of first output region 31), a dead space can be reduced between first output region 31 and first surrounding region 55. The effect produced by a combination of first output region 31 and first surrounding region 55 is also applicable to effects produced by a combination of second output region 32 and second surrounding region 56 and by a combination of third output region 33 and third surrounding region 57.

First surrounding region 55 and second surrounding region 56 are formed such that portions located between first output region 31 and second output region 32 are continuous. Likewise, second surrounding region 56 and third surrounding region 57 are formed such that portions located between second output region 32 and third output region 33 are continuous. In addition, the dead-end portions of first surrounding region 55 to third surrounding region 57 are joined by first connection conductive path 501 to third connection conductive path 503. In this way, first surrounding region 55 to third surrounding region 57 and first connection conductive path 501 to third connection conductive path 503 can form the continuous annular shape (shape of interconnected rings). This configuration can improve the degree of freedom of selecting current paths between components (transistors 100 constituting second switching element S2, fourth switching element S4, and sixth switching element S6, capacitors 200 constituting smoothing capacitor section 12, and second terminal 500 in this example) provided in first surrounding region 55, second surrounding region 56, and third surrounding region 57. Consequently, it is possible to further shorten the current paths between these components, thereby successfully reducing parasitic inductances of the current paths between the components.

First annular region 51 and second annular region 52 are formed such that portions located between first output region 31 and second output region 32 are continuous. Likewise, second annular region 52 and third annular region 53 are formed such that portions located between second output region 32 and third output region 33 are continuous. Dead spaces can be thereby reduced between first surrounding region 55 and second surrounding region 56 and between second surrounding region 56 and third surrounding region 57.

Moreover, by constituting the continuous annular shape from first surrounding region 55 to third surrounding region 57 and first connection conductive path 501 to third connection conductive path 503, a plurality of current paths can be formed in parallel to one another between the components provided in first surrounding region 55, second surrounding region 56, and third surrounding region 57. Consequently, it is possible to further reduce parasitic inductances of current paths between these components.

Sixth Exemplary Embodiment

Figure 14:
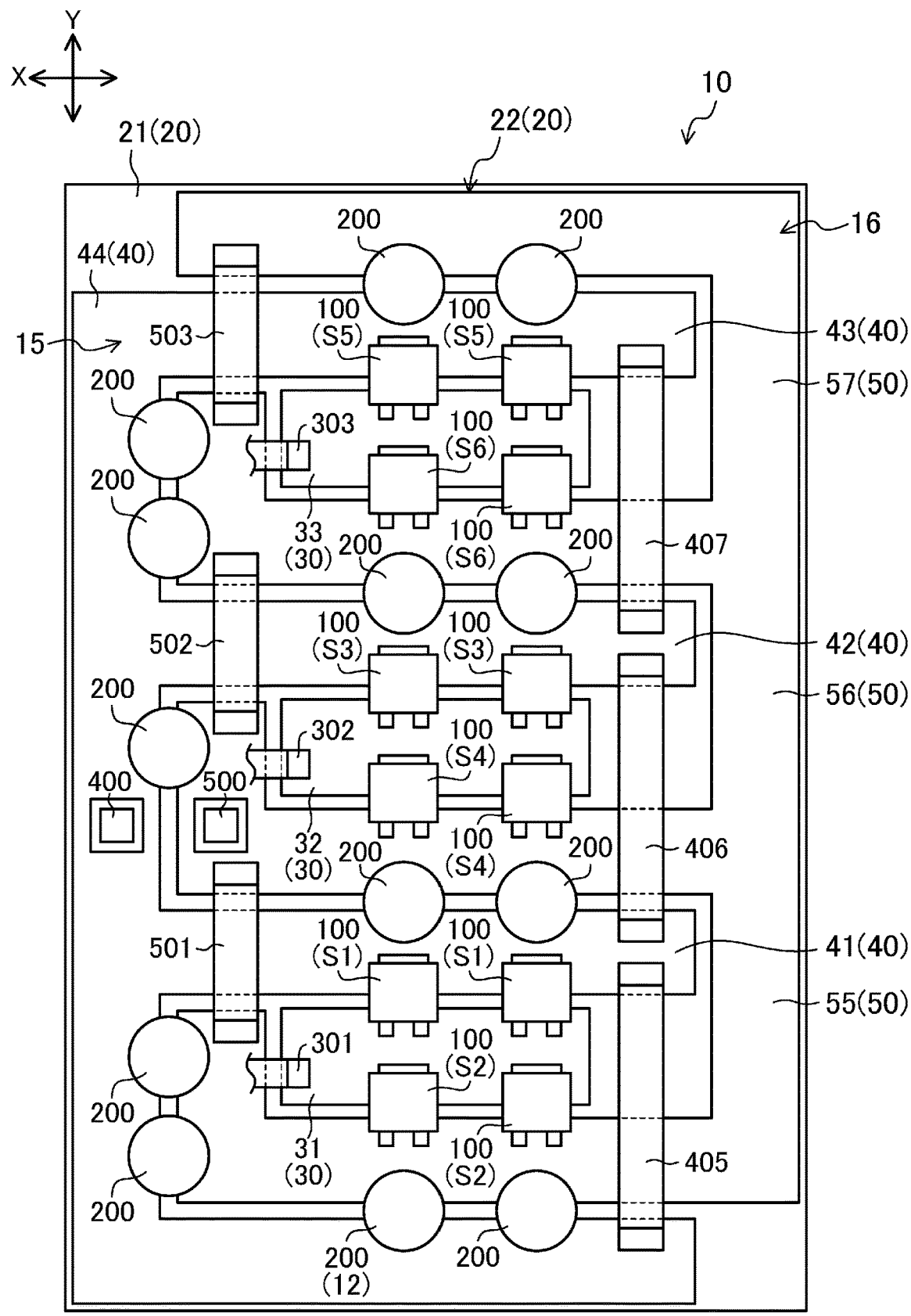
FIG. 14 is a plan view illustrating a structure of a switching power supply device according to a sixth exemplary embodiment.

FIG. 14 illustrates a configuration of switching power supply device 10 according to a sixth exemplary embodiment. Switching power supply device 10 according to the sixth exemplary embodiment includes first auxiliary conductive path 405, second auxiliary conductive path 406, and third auxiliary conductive path 407, in addition to the components in switching power supply device 10, illustrated in FIG. 13, according to the fifth exemplary embodiment.

[Auxiliary Conductive Path]

First auxiliary conductive path 405 extends between interconnection region 44 and first counter region 41 over a portion of first surrounding region 55, thereby connecting interconnection region 44 to first counter region 41. Second auxiliary conductive path 406 extends between first counter region 41 and second counter region 42 over portions of first surrounding region 55 and second surrounding region 56, thereby connecting first counter region 41 to second counter region 42. Third auxiliary conductive path 407 extends between second counter region 42 and third counter region 43 over portions of second surrounding region 56 and third surrounding region 57, thereby connecting second counter region 42 to third counter region 43. In this example, first auxiliary conductive path 405, second auxiliary conductive path 406, and third auxiliary conductive path 407 extend in second direction Y in a planar view.

Each of first auxiliary conductive path 405, second auxiliary conductive path 406, and third auxiliary conductive path 407 is formed of a conductive member (bus bar) having a planar shape. The conductive member of each of first auxiliary conductive path 405 to third auxiliary conductive path 406 has a configuration similar to a configuration of the conductive member of first conductive path 401 illustrated in FIG. 4. The conductive member of first auxiliary conductive path 405 is bonded at one end to interconnection region 44 with soldering and at the other end to first counter region 41 with soldering. The conductive member of second auxiliary conductive path 406 is bonded at one end to first counter region 41 with soldering and at the other end to second counter region 42 with soldering. The conductive member of third auxiliary conductive path 407 is bonded at one end to second counter region 42 with soldering and at the other end to third counter region 43 with soldering.

[Conductor Paths]

In the sixth exemplary embodiment, both of first conductor path 15 and second conductor path 16 have respective continuous annular paths. More specifically, first conductor path 15 includes first conductor patterns 40 (first counter region 41 to third counter region 43 and interconnection region 44) and first auxiliary conductive path 405 to third auxiliary conductive path 407. Second conductor path 16 includes second conductor patterns 50 (first surrounding region 55 to third surrounding region 57) and first connection conductive path 501 to third connection conductive path 503.

[Effect of Sixth Exemplary Embodiment]

As described above, first counter region 41 is connected to interconnection region 44 via first auxiliary conductive path 405. In this way, first counter region 41, interconnection region 44, and first auxiliary conductive path 405 can be disposed in an annular manner (namely, a discontinuous annular path can be formed). This configuration can improve the degree of freedom of selecting a current path (shortest current path) between components (transistors 100 constituting first switching element S1, capacitors 200 constituting smoothing capacitor section 12, and first terminal 400 in this example) provided in first counter region 41 and interconnection region 44. Consequently, it is possible to shorten the current paths between the components, thereby successfully reducing parasitic inductances of the current paths between these components.

Interconnection region 44 is connected to first counter region 41 via first auxiliary conductive path 405; first counter region 41 is connected to second counter region 42 via second auxiliary conductive path 406; and second counter region 42 is connected to third counter region 43 via third auxiliary conductive path 407. This configuration enables first counter region 41 to third counter region 43, interconnection region 44, and first auxiliary conductive path 405 to third auxiliary conductive path 407 to form a continuous annular shape (shape of interconnected rings). The configuration can improve the degree of freedom of selecting a current path (shortest current path) between components (transistors 100 constituting first switching element S1, third switching element S3, fifth switching element S5, capacitors 200 constituting smoothing capacitor section 12, and first terminal 400 in this example) provided in first counter region 41 to third counter region 43 and interconnection region 44. Consequently, it is possible to shorten the current paths between the components, thereby successfully reducing parasitic inductances of the current paths between these components.

The continuous annular shape is formed of first counter region 41 to third counter region 43, interconnection region 44, and first auxiliary conductive path 405 to third auxiliary conductive path 407. In this way, a plurality of current paths can be formed between components disposed within first counter region 41 to third counter region 43, and interconnection region 44. This configuration can further reduce the parasitic inductances of the current paths between these components.

By forming first auxiliary conductive path 405 from a conductive member having a planar shape, heat (for example, heat generated by a switching operation of first switching element S1) transmitted to first counter region 41 can be radiated through first auxiliary conductive path 405. In this case, heat (for example, heat generated by the switching operation of second switching element S2) transmitted to first surrounding region 55 can also be radiated through first connection conductive path 501. Thus, this configuration can further improve a heat dissipation property of switching power supply device 10. The effect produced by first auxiliary conductive path 405 is also applicable to effects produced by second auxiliary conductive path 406 and by third auxiliary conductive path 407.

Other Exemplary Embodiments

Figure 15:
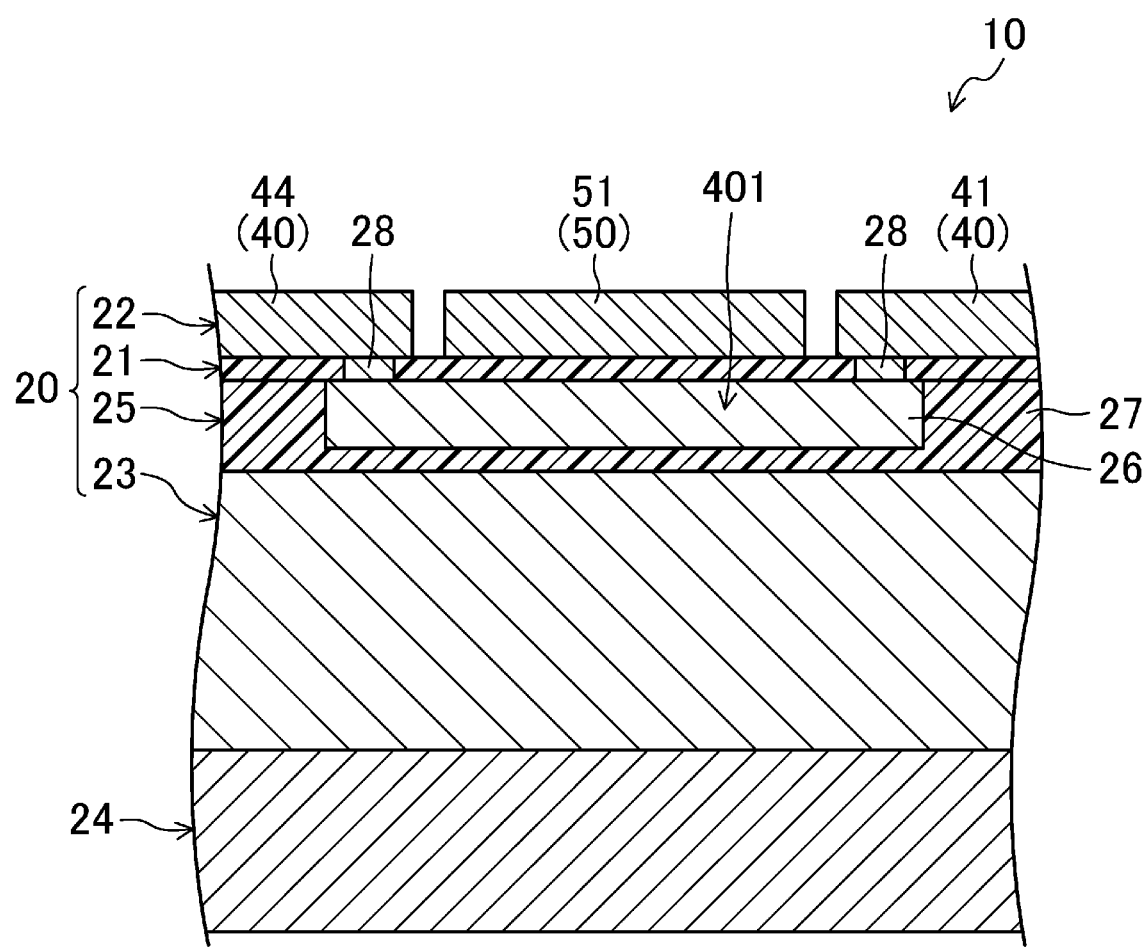
FIG. 15 is a cross-sectional view illustrating a modification of a conductive path.

The above description has been given regarding a case where first conductive path 401 is formed of a conductive member having a planar shape; however, a structure of first conductive path 401 is not limited to this. As an alternative example, first conductive path 401 may be formed of a conductive wire. As illustrated in FIG. 15, first conductive path 401 is formed in wiring layer 25. In an example of FIG. 15, wiring layer 25 is provided between insulating layer 21 and heat dissipation layer 23. In the example of FIG. 15, heat dissipation layer 23 is provided on the other surface of insulating layer 21 with wiring layer 25 therebetween. Wiring layer 25 includes wiring section 26 and insulating section 27. In the example of FIG. 15, wiring section 26 in wiring layer 25 is connected to first counter region 41 and to interconnection region 44 through via holes 28 provided in insulating layer 21. Likewise, each of second conductive path 402, third conductive path 403, first auxiliary conductive path 405 to third auxiliary conductive path 407, and first connection conductive path 501 to third connection conductive path 503 may be formed of a conductive member having a planar shape, a conductive wire, or wiring layer 25.

The above description has been given regarding a case where first output connection member 301 is formed of a conductive member having a planar shape; however, a structure of first output connection member 301 is not limited to this. As an alternative example, first output connection member 301 may be formed of a conductive wire. Likewise, each of second output connection member 302 and third output connection member 303 may be formed of either a conductive member having a planar shape or a conductive wire.

The above description has been given regarding a case where the power supply voltage is applied to first conductor pattern 40 and the ground voltage is applied to second conductor pattern 50; however, switching power supply device 10 may be configured such that the ground voltage is applied to first conductor pattern 40 and the power supply voltage is applied to second conductor pattern 50.

The above description has been given regarding a case where first switching element S1 includes the plurality of transistors 100; however, first switching element S1 may include a single transistor 100. Likewise, each of second switching element S2 to sixth switching element S6 includes either the plurality of transistors 100 or a single transistor 100.

Two or more of the exemplary embodiments and the modifications described above may be combined together as appropriate and performed. The exemplary embodiments and the modifications described above are merely intrinsically preferred examples and are not intended to narrow scopes of the disclosure and ranges of its application and usage.

INDUSTRIAL APPLICABILITY

As described above, the present disclosure is applicable to switching power supply devices.

The invention claimed is:

1. A switching power supply device, comprising:
   a substrate including an insulating layer and a conductive layer, the conductive layer being on one surface of the insulating layer and provided with an output pattern;
   a first conductor path provided on the one surface of the insulating layer, the first conductor path being applied with one of a power supply voltage and a ground voltage;
   a second conductor path provided on the one surface of the insulating layer, the second conductor path being applied with another of the power supply voltage and the ground voltage;
   a first switching element connected to the output pattern and to the first conductor path; and
   a second switching element connected to the output pattern and to the second conductor path,
   wherein at least one of the first conductor path and the second conductor path has a continuous annular path, with the continuous annular path completely and continuously surrounding the output pattern.

2. The switching power supply device according to claim 1, wherein
   a first conductor pattern and a second conductor pattern are in the conductive layer, the first conductor pattern being applied with the one of the power supply voltage and the ground voltage, the second conductor pattern being applied with the other of the power supply voltage and the ground voltage,
   the output pattern has a first output region,
   the first conductor pattern has a first counter region that faces the first output region,
   the second conductor pattern has a first annular region that continuously surrounds the first output region and the first counter region,
   the first switching element is connected to the first output region and to the first counter region,
   the second switching element is connected to the first output region and to the first annular region,
   the first conductor path includes the first conductor pattern, and
   the second conductor path includes the second conductor pattern.

3. The switching power supply device according to claim 2, further comprising:
   a first terminal connected to the first conductor pattern, the first terminal being applied with the one of the power supply voltage and the ground voltage;
   a second terminal connected to the second conductor pattern, the second terminal being applied with the other of the power supply voltage and the ground voltage; and
   a first conductive path,
   wherein the first conductor pattern has an interconnection region along the first annular region,
   the first terminal is disposed within the interconnection region,
   the second terminal is disposed within the first annular region, and
   the first conductive path extends over a portion of the first annular region to connect the first counter region to the interconnection region.

4. The switching power supply device according to claim 3, further comprising a first auxiliary conductive path disposed at a position different from a position of the first conductive path, the first auxiliary conductive path extending over another portion of the first annular region to connect the first counter region to the interconnection region.

5. The switching power supply device according to claim 2, further comprising a first output connection member connected to the first output region,
   wherein the first output connection member is in a planar shape.

6. The switching power supply device according to claim 2, wherein
   the first output region is in a rectangular shape, and
   the first annular region has an inner edge in a rectangular shape.

7. The switching power supply device according to claim 2, further comprising:
   a third switching element;
   a fourth switching element;
   a fifth switching element; and
   a sixth switching element,
   wherein the output pattern further includes a second output region and a third output region,
   the first conductor pattern further includes a second counter region and a third counter region, the second counter region facing the second output region, and the third counter region facing the third output region,
   the second conductor pattern further includes a second annular region and a third annular region, the second annular region continuously surrounding the second output region and the second counter region, and the third annular region continuously surrounding the third output region and the third counter region,
   the third switching element is connected to the second output region and to the second counter region,
   the fourth switching element is connected to the second output region and to the second annular region,
   the fifth switching element is connected to the third output region and to the third counter region, and
   the sixth switching element is connected to the third output region and to the third annular region.

8. The switching power supply device according to claim 7, wherein
   each of the first output region, the second output region, and the third output region is to extend in a first direction, and the first output region, the second output region, and the third output region are arranged in order at predetermined intervals in a second direction, the second direction being orthogonal to the first direction,
   the first counter region, the second counter region, and the third counter region have portions that extend in the first direction and along the first output region, the second output region, and the third output region, respectively,
   portions of the first annular region and the second annular region are to be continuous, the portions being located between the first output region and the second output region, and
   portions of the second annular region and the third annular region are to be continuous, the portions being located between the second output region and the third output region.

9. The switching power supply device according to claim 8, further comprising:
- a first terminal connected to the first conductor pattern, the first terminal being applied with the one of the power supply voltage and the ground voltage;
- a second terminal connected to the second conductor pattern, the second terminal being applied with the other of the power supply voltage and the ground voltage;
- a first conductive path;
- a second conductive path; and
- a third conductive path,
- wherein the first conductor pattern has an interconnection region around the first annular region, the second annular region, and the third annular region,
- the first terminal is disposed within the interconnection region,
- the second terminal is disposed within a continuous annular region, the continuous annular region including the first annular region, the second annular region, and the third annular region,
- the first conductive path extends over a portion of the first annular region to connect the first counter region to the interconnection region,
- the second conductive path extends over a portion of the second annular region to connect the second counter region to the interconnection region, and
- the third conductive path extends over a portion of the third annular region to connect the first counter region to the interconnection region.

10. The switching power supply device according to claim 9, further comprising:
- a first auxiliary conductive path disposed at a position different from a position of the first conductive path, the first auxiliary conductive path extending over a portion of the first annular region to connect the first counter region to the interconnection region;
- a second auxiliary conductive path that extends over portions of the first annular region and the second annular region to connect the first counter region to the second counter region; and
- a third auxiliary conductive path that extends over portions of the second annular region and the third annular region to connect the second counter region to the third counter region.

11. The switching power supply device according to of claim 8, further comprising:
- a first output connection member connected to the first output region;
- a second output connection member connected to the second output region; and
- a third output connection member connected to the third output region,
- the substrate including the insulating layer, the conductive layer, and a heat dissipation layer provided on another surface of the insulating layer,
- the second output connection member being secured to the second output region by a coupling screw that penetrates the conductive layer and the insulating layer and is fixed to the heat dissipation layer.

12. The switching power supply device according to claim 7, wherein
- each of the first output region, the second output region, and the third output region is in a rectangular shape, and
- each of the first annular region, the second annular region, and the third annular region has an inner edge in a rectangular shape.

13. The switching power supply device according to claim 3, wherein the first terminal and the second terminal are disposed adjacent to each other.

14. The switching power supply device according to claim 2, further comprising a capacitor connected to the first conductor pattern and to a second conductor pattern.

15. The switching power supply device according to claim 1, wherein
- the output pattern has a first output region,
- a first conductor pattern and a second conductor pattern are in the conductive layer, the first conductor pattern being applied with the one of the power supply voltage and the ground voltage, the second conductor pattern being applied with the other of the power supply voltage and the ground voltage,
- the first conductor pattern has a first counter region that faces the first output region,
- the second conductor pattern has a first surrounding region with a dead-end portion and surrounds the first output region and the first counter region,
- the first switching element is connected to the first output region and to the first counter region,
- the second switching element is connected to the first output region and to the first surrounding region,
- the first conductor path includes the first conductor pattern, and
- the second conductor path includes the second conductor pattern and a first connection conductive path that joins the dead-end portion of the first surrounding region of the second conductor pattern to be an annular path that continuously surrounds the first output region.

16. The switching power supply device according to claim 1, further comprising a parallel conductive path connected in parallel to the first conductor path or to the second conductor path.

* * * * *